United States Patent
Tominaga et al.

(10) Patent No.: US 10,374,075 B2
(45) Date of Patent: Aug. 6, 2019

(54) SILICON CARBIDE SEMICONDUCTOR DEVICE AND MANUFACTURING METHOD FOR THE SAME

(71) Applicant: Mitsubishi Electric Corporation, Chiyoda-ku (JP)

(72) Inventors: Takaaki Tominaga, Tokyo (JP); Shiro Hino, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/768,251

(22) PCT Filed: Sep. 13, 2016

(86) PCT No.: PCT/JP2016/076920
§ 371 (c)(1),
(2) Date: Apr. 13, 2018

(87) PCT Pub. No.: WO2017/081935
PCT Pub. Date: May 18, 2017

(65) Prior Publication Data
US 2018/0323299 A1    Nov. 8, 2018

(30) Foreign Application Priority Data

Nov. 12, 2015   (JP) .................................. 2015-221704

(51) Int. Cl.
*H01L 29/78*     (2006.01)
*H01L 29/06*     (2006.01)
(Continued)

(52) U.S. Cl.
CPC ...... *H01L 29/7802* (2013.01); *H01L 21/0465* (2013.01); *H01L 29/06* (2013.01);
(Continued)

(58) Field of Classification Search
CPC . H01L 29/7802; H01L 29/06; H01L 29/0615; H01L 29/1037; H01L 29/1608; H01L 29/66068; H01L 21/0465
See application file for complete search history.

(56) References Cited

U.S. PATENT DOCUMENTS 8,809,871 B2    8/2014  Uchida
2012/0292742 A1*  11/2012  Itoh .................. H01L 29/66068
                                            257/607
(Continued)

FOREIGN PATENT DOCUMENTS

JP    2010-267762 A    11/2010
JP    2011-49267 A     3/2011
(Continued)

OTHER PUBLICATIONS

Notification of Reasons for Refusal dated Sep. 4, 2018, in Japanese Patent Application No. 2017-550017, with unedited computer generated English translation.
(Continued)

*Primary Examiner* — Mark W Tornow
(74) *Attorney, Agent, or Firm* — Oblon, McClelland, Maier & Neustadt, L.L.P.

(57) ABSTRACT

A silicon carbide semiconductor device includes: a pair of first well regions separated by distance W1 in surface layer portions of a silicon carbide drift layer and having p-type impurity concentration higher than n-type impurity concentration of the silicon carbide drift layer; a pair of second well regions provided adjacent to bottom faces of the first well regions, separated by distance W2 larger than the distance W1 by 0.8 μm or more, and having p-type impurity concentration higher than n-type impurity concentration of the silicon carbide drift layer from 1.1 times to 4.2 times lower than the first well regions; and a highly concentrated JFET region provided between the pair of first well regions and
(Continued)

between the pair of second well regions and having n-type impurity concentration higher than that of the silicon carbide drift layer and lower than p-type impurity concentration or the second well regions.

12 Claims, 21 Drawing Sheets

(51) Int. Cl.
  *H01L 21/04* (2006.01)
  *H01L 29/10* (2006.01)
  *H01L 29/16* (2006.01)
  *H01L 29/66* (2006.01)
(52) U.S. Cl.
  CPC ...... *H01L 29/0615* (2013.01); *H01L 29/1037* (2013.01); *H01L 29/1608* (2013.01); *H01L 29/66068* (2013.01)

(56) References Cited

U.S. PATENT DOCUMENTS

| | | | | |
|---|---|---|---|---|
| 2015/0028350 A1* | 1/2015 | Suvorov | ............ | H01L 29/1608 257/77 |
| 2015/0097226 A1* | 4/2015 | Lichtenwalner | .... | H01L 29/4925 257/329 |
| 2015/0236012 A1* | 8/2015 | Hino | ................... | H01L 27/0629 257/77 |
| 2016/0111533 A1* | 4/2016 | Yen | ..................... | H01L 29/7806 257/77 |
| 2017/0263757 A1* | 9/2017 | Saikaku | .............. | H01L 29/0688 |

FOREIGN PATENT DOCUMENTS

| | | |
|---|---|---|
| JP | 2011-193020 A | 9/2011 |
| JP | 2013-102245 A | 5/2013 |
| JP | WO 2012/056704 A1 | 3/2014 |
| JP | 2015-115373 A | 6/2015 |
| WO | WO 2004/061974 A2 | 7/2004 |
| WO | WO 2004/061974 A3 | 7/2004 |
| WO | WO 2004/097926 A1 | 11/2004 |
| WO | WO 2014/083771 A1 | 6/2014 |

OTHER PUBLICATIONS

International Search Report dated Dec. 6, 2016 in PCT/JP2016/076920, filed on Sep. 13, 2016.

* cited by examiner

Fig. 6
(a)
Structure A
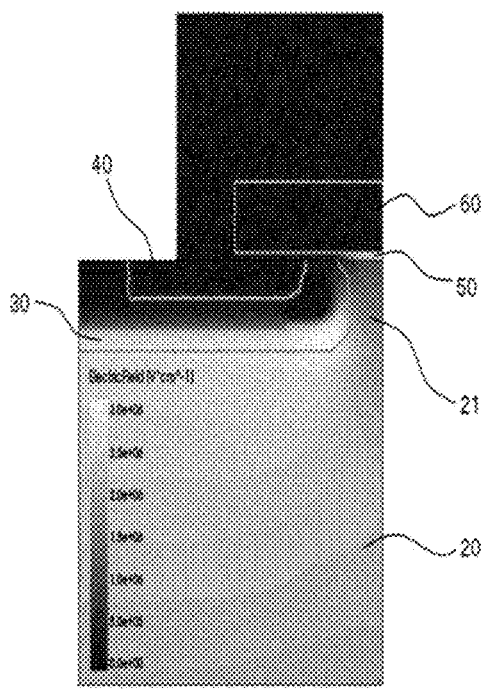
(b)
Structure B
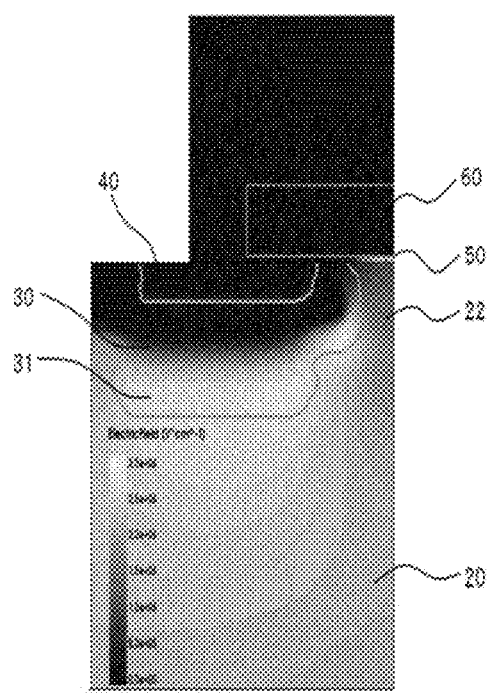

Fig. 20
(a)
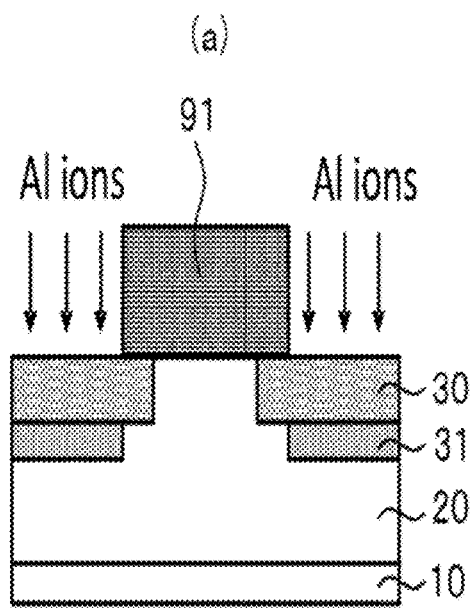
(b)
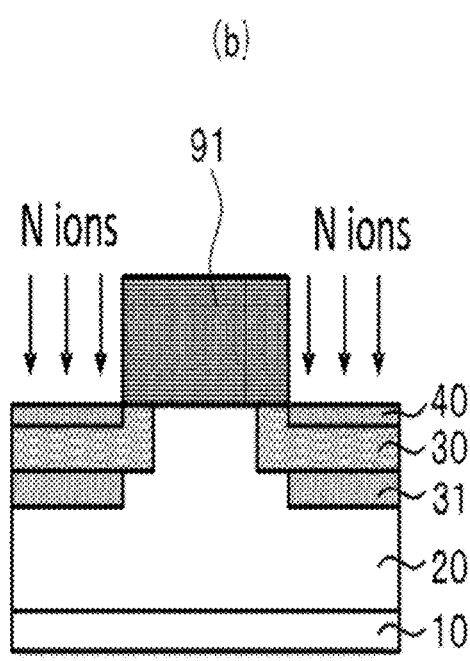

Fig. 21
(a)
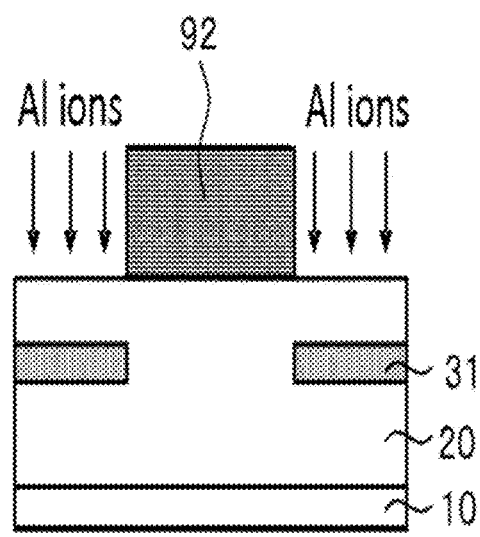
(b)
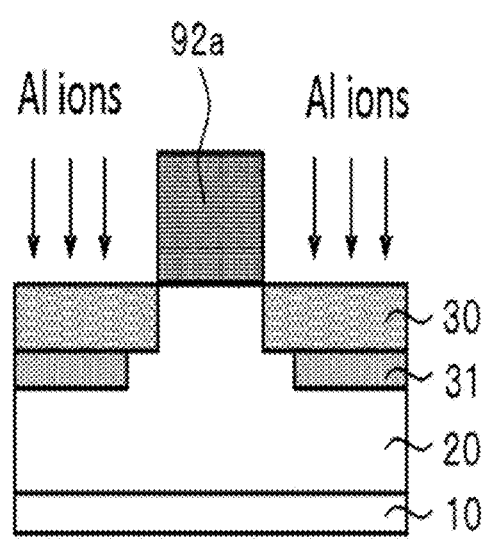

US 10,374,075 B2

SILICON CARBIDE SEMICONDUCTOR DEVICE AND MANUFACTURING METHOD FOR THE SAME

TECHNICAL FIELD

The present invention relates to a silicon carbide semiconductor device and a manufacturing method therefor.

BACKGROUND ART

Since a wide band gap semiconductor material such as silicon carbide has a higher dielectric withstand voltage than silicon, it is possible to increase impurity concentration in the substrate thereof and thus reduce resistance of the substrate as compared with the case of using a silicon material. This resistance reduction in the substrate leads to a power loss reduction in switching operation of a power device. In addition, since the wide-gap semiconductor material has higher thermal conductivity and better mechanical strength than silicon, it is expected as a feasible material for a compact, low-loss, and high-efficiency power device.

Among power semiconductor devices using silicon carbide (silicon carbide power semiconductor devices), a metal-oxide semiconductor field effect transistor (MOSFET), which is a field-effect transistor formed with a metal-insulator-semiconductor junction, is broadly used.

In an n-type silicon carbide drift layer epitaxially grown on an n-type silicon carbide substrate, a conventional silicon carbide semiconductor device includes an n-type source region, a first p-type well region with p-type impurity concentration of about $10^{19}$ cm$^{-3}$ formed under the source region, a second p-type well region with the p-type impurity concentration in a range from about $10^{16}$ cm$^{-3}$ to $10^{17}$ cm$^{-3}$ formed next to the source region in the lateral direction on the side of a gate contact, the concentration being lower than that of the first well region by two or more orders of magnitude, a p-plug region with the p-type impurity concentration in a range from about $5\times10^{18}$ cm$^{-3}$ to $1\times10^{21}$ cm$^{-3}$ formed on the side of a source contact, the region being a well contact region connected to the source contact, and a threshold value adjustment region with n-type impurity concentration in a range from about $10^{15}$ cm$^{-3}$ to $10^{16}$ cm$^{-3}$ formed on the source region (for example, refer to Patent Document 1).

Further, in an n-type silicon carbide drift layer epitaxially grown on an n-type silicon carbide substrate, another conventional silicon carbide semiconductor device includes an n-type source region, a second base region being the first p-type well region with p-type impurity concentration in a range from $1\times10^{17}$ cm$^{-3}$ to $5\times10^{18}$ cm$^{-3}$ formed under the source region, a first base region being the second p-type well region with the p-type impurity concentration in a range from $5\times10^{15}$ cm$^{-1}$ to $5\times10^{18}$ cm$^{-1}$ formed next to the source region in the lateral direction on the side of a gate electrode, the concentration being lower than that of the second base region, and an n-type high concentration layer with n-type impurity concentration formed on the bottom of the second base region, the concentration being higher than that of the silicon carbide drift layer (for example, refer to Patent Document 2).

PRIOR ART DOCUMENTS

Patent Document

Patent Document 1: Japanese Patent Laid-Open Publication No. 2011-103020
Patent Document 2: Japanese Patent Laid-Open Publication No. 2011-49267

SUMMARY OF THE INVENTION

Problems to be Solved by the Invention

A power semiconductor device generally has a vertical structure in which withstand voltage is retained by a drift layer. In a case where the silicon carbide semiconductor device is a MOSFET, a large p-n junction electric field at a p-n junction interface in the silicon carbide semiconductor device is generated owing to a high voltage applied to a drain electrode in an off-state. When a p-n junction electric field intensity is large, problems of reliability degradation in the p-n junction and leakage current increase will arise. Conventional design methods such as shortening a separation distance between adjacent well regions, making the well regions shallower, and reducing impurity concentration of the neighboring well regions, have been used for the reduction of the p-n junction electric field intensity. Since a problem of on-voltage increase at the on-state arises when these methods are used for reducing the p-n junction electric field intensity, considering the trade-off between the p-n junction electric field intensity and the on-voltage, a condition suitable for its application needs to be selected in designing the silicon carbide semiconductor device. Therefore, the reduction of the p-n junction electric field intensity while the on-voltage increase is suppressed has not been able to be achieved.

In the conventional silicon carbide semiconductor device described in Patent Document 1, two well regions with respective different p-type impurity concentrations are provided in which one is under the source region and the other is on the side of the gate electrode in the lateral direction, however in Patent document 1, only the structure and the manufacturing method therefor are described and a specific method to reduce the p-n junction electric field intensity in the off-state as well as to suppress the increase in the on-voltage is not described, and thus there is a problem in that the method is unknown.

Further, in the conventional silicon carbide semiconductor device described in Patent Document 2, two well regions with respective different p-type impurity concentrations are provided in which one is under the source region and the other is on the side of the gate electrode in the lateral direction, and an n-type high concentration layer with the n-type impurity concentration higher than that of the silicon carbide drift layer is formed on the bottom of the well regions formed under the source region, so that resistance of a JFET region within the silicon carbide drift layer, placed between the well re ions separated is decreased. However in Patent document 2, a specific technique to suppress the increase in the on-voltage as well as to reduce the p-n junction electric field intensity in the off-state is not described, and thus there is a problem in that the method is unknown.

The present invention is devised to solve problem described above and an object thereof is to provide a silicon carbide semiconductor device that can reduce leakage current in the off-state by decreasing the p-n junction electric field intensity while the increase in the on-voltage is suppressed.

Means for Solving Problem

A silicon carbide semiconductor device includes a silicon carbide semiconductor substrate, a silicon carbide drift layer of a first conductive type provided on the silicon carbide substrate, first well regions of a second conductive type provided in surface layer portions of the silicon carbide drift layer, second well regions of the second conductive type provided adjacent to respective bottom faces of the first well regions, source regions of the first conductive type provided in respective surface layer portions of the first well regions, a highly concentrated JFET region of the first conductive type formed deeper than the second well regions and provided between the first well regions as well as between the second well regions and an impurity concentration of the first conductive type is larger than that of the silicon carbide drift layer, a gate insulating film provided on a top face of the highly concentrated JFET region, top faces of the first well regions, and top faces of the source regions to be in contact with the highly concentrated JFET region, the first well regions, and the source regions, and a gate electrode provided on and in contact with the gate insulating film. wherein a separation distance W2 of the second well regions is larger than a separation distance W1 of the first well regions by 0.8 μm or more and an impurity concentration of the second conductive type in the first well regions is 1.1 times to 4.2 times an impurity concentration of the second conductive type in the second well regions.

Further, a manufacturing method for a silicon carbide semiconductor device includes a first step of epitaxially growing a silicon carbide drift layer of a first conductive type on a silicon carbide substrate, a second step of forming a first implantation mask on the silicon carbide drift layer and implanting impurity ions of a second conductive type in the silicon carbide drift layer to form a first well region of the second conductive type in a surface layer portion of the silicon carbide drift layer, a third step of forming a second implantation mask whose width is larger than the first implantation mask on the silicon carbide drift layer, and implanting impurity ions of the second conductive type in the silicon carbide drift layer to form a second well region of the second conductive type on a region adjacent to a bottom face of the first well region, a fourth step of forming a source region of the first conductive type by implanting impurity ions of the first conductive type in a surface layer portion of the first well region, and a fifth step of implanting impurity ions of the first conductive type into a region ranging from a top face of the silicon carbide drift layer down to a depth larger than the depth of the first well region to form a highly concentrated HET region of the first conductive type, a sixth step of forming a gate insulation film on a top face of the first well region, a top face of the source region, and a top face of the highly concentrated NET region, and a seventh step of forming a gate electrode on the gate insulation film.

Effects of the Invention

In a silicon carbide semiconductor device provided according to the present invention, the leakage current in the off-state can be reduced by decreasing the p-n junction electric field intensity while the increase in the on-voltage is suppressed.

In addition, a manufacturing method according to the present invention can provides the silicon carbide semiconductor device in which the leakage current in the off-state can be reduced by decreasing the p-n junction electric field intensity while the increase in the on-voltage is suppressed,

BRIEF DESCRIPTION OF THE DRAWINGS

FIG. 6 includes contour diagrams each showing an electric field intensity distribution in a cross section for the conventional silicon carbide semiconductor device and the silicon carbide semiconductor device according to the present invention.

FIG. 20 includes diagrams Showing a manufacturing method for the silicon carbide semiconductor device according to Embodiment 4 of the present invention.

FIG. 21 includes diagrams showing a manufacturing method for the silicon carbide semiconductor device according to Embodiment 5 of the present invention.

EMBODIMENTS FOR CARRYING OUT THE INVENTION

Embodiment 1

Figure 1:
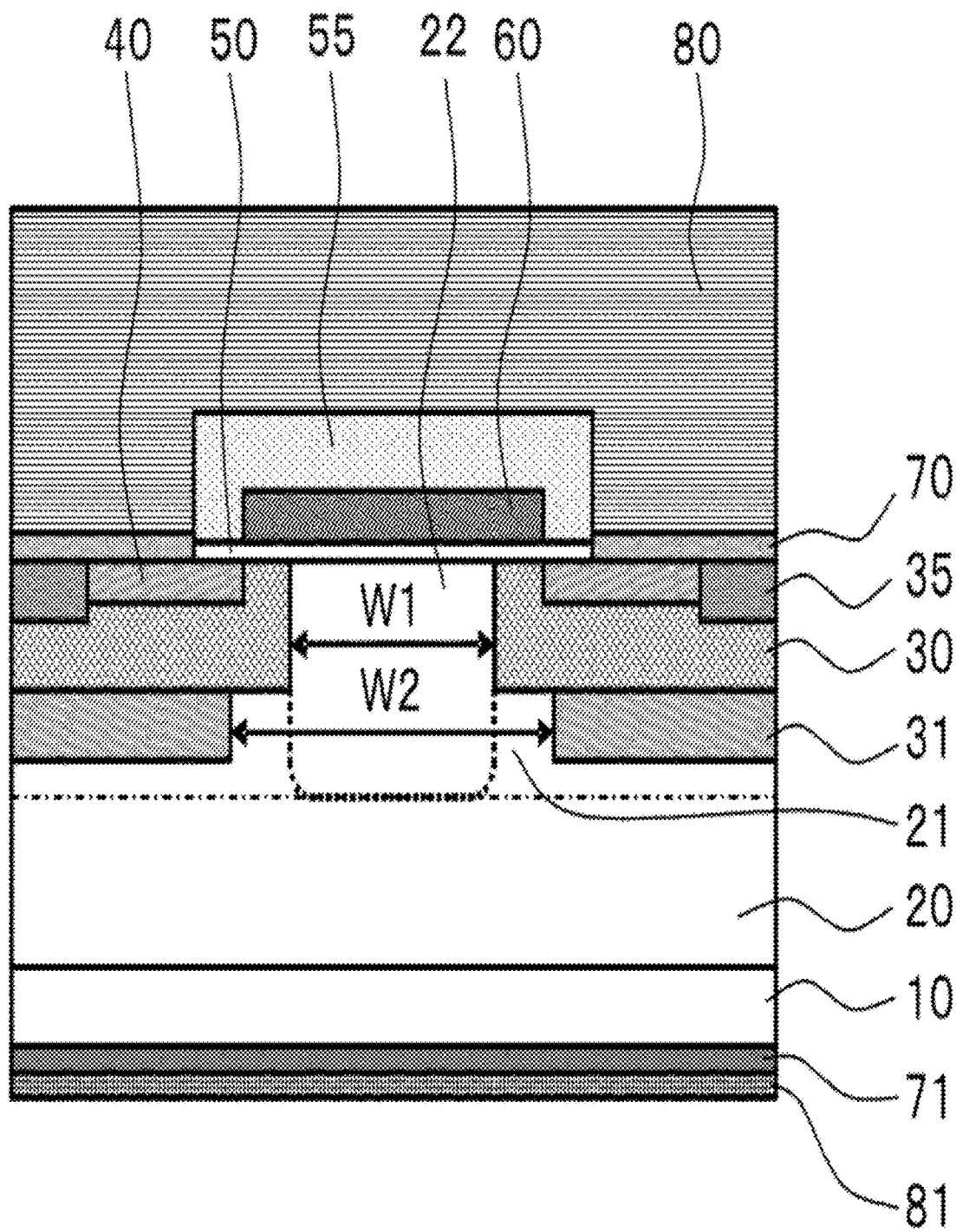
FIG. 1 is a schematic cross-sectional diagram showing a structure of silicon carbide semiconductor device according to Embodiment 1 of the present invention FIG. 2 includes diagrams showing a manufacturing method for the silicon carbide semiconductor device according to Embodiment 1 of the present invention.

First, a configuration of a silicon carbide semiconductor device according to Embodiment 1 of the present invention will be described. Note that in the description of the present invention, a first conductive type is an n-type and a second conductive type is a p-type. FIG. 1 is a schematic Cross-sectional diagram showing a structure of a silicon carbide semiconductor device according to Embodiment 1 of the present invention. In the present embodiment 1 the case of the silicon carbide semiconductor device being a MOSFET will be described. Note that, FIG. 1 shows a configuration of a unit cell in the silicon carbide semiconductor device and the silicon carbide semiconductor device includes a plurality of unit cells shown in FIG. 1 which is disposed in the lateral direction.

In the present invention, a longitudinal direction means a direction normal to a silicon carbide substrate 10 of the silicon carbide semiconductor device. For example, in FIG. 1, it is an up-and-down direction on the paper plane. Further, a lateral direction means a direction of a plane of the silicon carbide substrate 10. For example, in FIG. 1, it is a left-and-right direction on the paper plane. Further, a depth or a thickness means a distance in the longitudinal direction, and a width means a distance in the lateral direction. Still further, in FIG. 1, for example, the front side means the upside in the paper plane and the back side means the downside in the paper plane. Also, a plan view means a view in which a face being parallel to the lateral direction is seen from the longitudinal direction.

In FIG. 1, an n-type silicon carbide drift layer 20 is epitaxially grown and formed on the first main face of an n-type low resistance silicon carbide semiconductor substrate 10 in the 4H poly-type. In the silicon carbide substrate 10, the crystal orientation of the first main face is (000.1) and inclined by four degrees with respect to the C axis direction.

On the front side of the silicon carbide drift layer 20, the first p-type well regions 30 with aluminum (Al) being the first impurity as a p-type impurity are formed. On the side of the silicon carbide substrate 10 with respect to the first well regions 30, the second p-type well regions 31 are formed in contact with the first well regions 30. The second well regions are electrically connected to the first well regions 30. The second well regions 31 are formed with the p-type impurity concentration lower than that of the first well regions 30. As shown in FIG. 1, in the unit cell of the silicon carbide semiconductor device, first well regions 30 and second well regions 31 are respectively formed with distances W1 and W2 in the lateral direction, and the gap between the second well regions 31 is larger than that between the first well regions 30. Namely, Distance W2 >Distance W1. Note that, hereinafter, the gaps shown in FIG. 1 between the first well regions 30 and between the second well regions 31 in the lateral direction are referred to as separation distances. In addition, regarding source regions 40 and well contact regions 35, gaps in the lateral direction are referred to as separation distances as well.

In a MOSFET, a region between the separated well regions in the silicon carbide drift layer 20 in the unit cell is referred to as a JFET region. A JFET region 21 includes, on the front side, a highly concentrated JFET region 22 formed with an n-type impurity concentration higher than that of the silicon carbide drift layer 20. Therefore, the JFET region 21 contains the highly concentrated JFET region 22, and the entire JFET region 21 may be configured as the highly concentrated JFET region 22. The highly concentrated JFET region 22 is formed at least with the same width as the separation distance W1 of the first well regions 30 and formed down to a corresponding depth to the bottom face of the first well regions 30. In FIG. 1, the highly concentrated JFET region 22 is formed with the same width as the separation distance W1 of the first well regions 30 and with the depth indicated by the dashed and dotted line positioned deeper than the bottom face of the second well regions 31. Moreover, as for the width of the highly concentrated JFET region 22, it is preferable that the width be the same as the separation distance W2 of the second well regions 31. Hereinafter, when it is not necessary to distinguish the highly concentrated JFET region 22 from the JFET region 21 both of them may be simply referred to as the JFET region 21.

In the surface layer portions of the first well regions 30, n-type source regions 40 containing nitrogen being a second impurity as the n-type impurity is formed down to a depth smaller than that of the first well regions 30. Further, in the surface layer portions of the first well regions 30, the p-type well contact regions 35 are formed in contact with the source regions 40 and formed down to a depth larger than that of the source regions 40. The well contact regions 35 are electrically connected to the first well regions 30.

A gate insulating film 50 made of an oxide insulating material is formed on the top face of the highly concentrated JFET region 22, the top faces of the first well regions 30 sandwiched between the highly concentrated JFET region 22 and the source regions 40, and the top faces of a part of the source regions 40. Further, on the gate insulating film 50, a gate electrode 60 is formed so as to be opposed to the highly concentrated JFET region 22 and portions of the first well regions 30 sandwiched between the highly concentrated JFET region 22 and the source regions 40. Note that, in the first well regions 30, regions which are opposed to the gate electrode 60 via the gate insulating film 50 and in which inversion layers are formed when the silicon carbide semiconductor device is in an on-state is called a channel region.

Over the gate electrode 60, an interlayer insulating film 55 made of an oxide insulating material is formed across the range under which the gate insulating film 50 exists. On the regions not covered by the gate insulating film 50 in the source regions 40 and on the well contact regions 35 on the side in contact with the source regions 40, front side ohmic electrodes 70 for reducing contact resistance between source electrodes 80 and the silicon carbide are formed. On the front side ohmic electrodes 70 and on the interlayer insulating film 55, the source electrode 80 is formed. Also, on the second main face opposite to the first main face of the silicon carbide substrate 10, namely, on the back side, a back side ohmic electrode 71 is formed, and a drain electrode 81 is formed on the back side ohmic electrode 71.

Further, in some part of the region where no unit cell exists in the silicon carbide semiconductor device, the gate electrode 60 is electrically short-circuited to a gate pad and a gate wiring through a gate contact hole opened in the interlayer insulating film 55 (not shown).

The silicon carbide semiconductor device is configured as described above.

Figure 2:
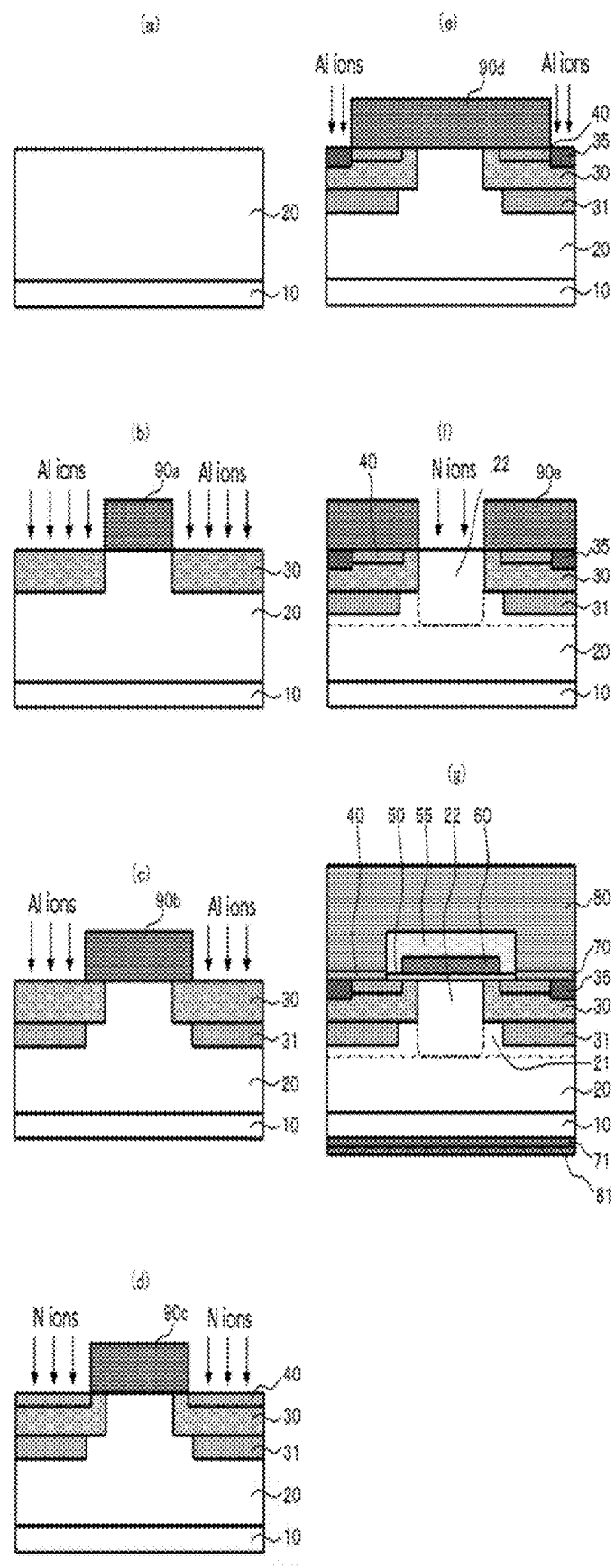

Next, a manufacturing method for the silicon carbide semiconductor device will be described. FIG. 2 is diagrams showing the manufacturing method for the silicon carbide semiconductor device according to Embodiment 1 of the present invention.

First, as shown in FIG. 2(*a*), on the top face of the low resistance n-type silicon carbide substrate 10 having the 4H polytype whose crystal orientation of the first main face is (0001), the n-type silicon carbide drift layer 20 is epitaxially grown by a chemical vapor deposition (CVD) method. The n-type impurity concentration of the silicon carbide drift layer 20 is, for example, between $1\times10^{15}$ cm$^{-3}$ and $1\times10^{17}$ cm$^{-3}$. The thickness of the silicon carbide drift layer 20 is, for example, between 5 μm and 50 μm.

Next, as shown in FIG. 2(*b*), an implantation mask 90*a* is formed on the front side of the silicon carbide drift layer 20 by applying photoresist or the like, and the first p-type well region 30 is formed by ion-implanting Al as the first impurity of the p-type. The depth of the Al ion implantation is set less than the thickness of the silicon carbide drift layer 20, for example, being between 0.5 μm and 3 μm. The impurity concentration of the ion-implanted Al is, for example, between $1\times10^{17}$ cm$^{-3}$, and is set higher than higher than the n-type impurity concentration of the silicon carbide drift layer 20. After Al is ion-implanted, the implantation mask 90*a* is removed.

Next, as shown in FIG. 2(*e*) an implantation mask 90*b* is formed on the front side of the silicon carbide drift layer 20 by applying photoresist or the like, and the second well regions 31 of the p-type are formed by ion-implanting Al as the first impurity of the p-type. The width of the implantation mask 90*b* is set to be wider than the width of the implantation mask 90*a* used in forming the first well regions 30. The depth of the Al ion implantation is set less than the thickness of the silicon carbide drift layer 20, but larger than the thickness of the first well regions 30. For example, the peak depth may substantially be at the range between 0.6 μm and 4 μm. Also, the impurity concentration of the ion-implanted Al is set higher than the n-type impurity concentration of the silicon carbide drift layer 20, and less than the impurity concentration of the first well regions 30. For example, the impurity concentration of the ion-implanted Al is 0.1 times or more and less than one time the impurity concentration of the first well regions 30. After Al is ion-implanted the implantation mask 90*b* is removed.

Next, as shown in. FIG. 2(*d*), an implantation mask 90*c* is formed on the front side of the silicon carbide drift layer 20 by applying photoresist or the like, and the n-type source regions 40 are formed by ion-implanting N as the second impurity of the n-type. The depth of the n-type ion implantation is set less than the thickness of the first well regions 30. In addition, the impurity concentration of the ion-implanted N is, for example, between $1\times10^{18}$ cm$^{-3}$ and $1\times10^{21}$ cm$^{-3}$, and is set higher than the p-type impurity concentration of the first well regions 30. After N is ion-implanted, the implantation mask 90*c* is removed.

Next, as shown in FIG. 2(*e*), an implantation mask 90*d* is formed on the front side of the silicon carbide drift layer 20 by applying photoresist or the like and the p-type well contact regions 35 are formed by ion-implanting Al as the first impurity of the p-type. As shown in FIG. 1, the well contact regions 35 are formed down to a depth from the surface layer portions of the source regions 40 to the inside of the first well regions 30. The well contact regions 35 are provided to obtain a favorable electrical contact between the first well regions 30 and the front side ohmic electrodes 70 electrically connected to the source electrode 80. It is preferable for the p-type impurity concentration of the well contact regions 35 to be higher than the p-type impurity concentration of the first well regions 30. When Al is ion-implanted, the silicon carbide substrate 10 can which the silicon carbide drift layer 20 is formed is preferably heated up to 150 degrees C. or higher in order to reduce the resistance of the well contact regions 35. After Al is ion-implanted, the implantation mask 90*d* is removed.

Next, as shown in FIG. 2(*f*), on the front side of the silicon carbide drift layer 20, an implantation mask 90*e* is formed by applying photoresist or the like, and then, the impurity N as the second impurity of the n-type is ion-implanted so as for the n-type impurity concentration of the JFET region 21 to be set higher than the n-type impurity concentration of the silicon carbide drift layer 20, thereby forming in the n-type JFET region 21 the highly concentrated JFET region 22 with higher n-type impurity concentration. In FIG. 2(*f*), the width of the highly concentrated JFET region 22 is shown to be equal to the separation distance of the first well regions 30. However, it is more preferable for the highly concentrated JFET region 22 to be formed with the width equal to the separation distance of the second well regions 31 or to be formed so as to include the JFET region 21. Further, it is preferable for the highly concentrated JFET region to be formed down to the depth indicated by the dashed and dotted line shown in FIG. 1 and FIG. 2(*f*), namely, down to a depth below the bottom face of the second well regions 31. It is preferable for the n-type impurity concentration of the ion-implanted N to be lower than the p-type impurity concentrations for the first well regions 30 and the second well regions 31. For example, the impurity concentration may be between $5\times10^{15}$ cm$^{-3}$ and $1\times10^{18}$ cm$^{-3}$. This is because, when a reverse bias is applied to the p-n junction foamed between the first well regions 30 as well as the second well regions 31 and the highly concentrated JFET region 22, the lower impurity concentration of the highly concentrated JFET region 22 relative to the impurity concentrations for the first well regions 30 as well as the second well regions 31 will make a depletion layer extend toward the highly concentrated JFET region 22. After N is ion-implanted, the implantation mask 90*e* is removed.

Next, by using a thermal processing apparatus, annealing is performed at a temperature ranging from 1300 degrees C. to 1900 degrees C. for a period of time ranging from 30 seconds to one hour in inert gas atmosphere such as argon (Ar) to activate the ion-implanted N and Al.

Next, the front side of the silicon carbide drift layer 20 including the first well regions 30, the source regions 40, and the well contact regions 35 is thermally oxidized to form the gate insulating film 50 with a desired thickness. Next, a conductive polycrystalline silicon layer is formed on the gate insulating film 50 by a low pressure CVD method and by patterning the formed layer, the gate electrode 60 is formed.

Next, the interlayer insulating film 55 is formed by the low pressure CVD method. Next, contact holes penetrating the interlayer insulating film 55 and the gate insulating film 50 and reaching the well contact regions 35 and the source regions 40 are formed.

Next, a metal layer containing nickel (Ni) as a main component is formed by a sputtering method or the like. Then, a thermal process is performed at a temperature ranging from 600 degrees C. to 1100 degrees C. to form a silicide between the silicon carbide layer and the metal film through the reaction between the metal layer containing Ni as the main component and the silicon carbide. Then, a remaining metal layer on the interlayer insulating film 55 except for the silicide is removed by wet etching using one of a sulfuric acid, a nitric acid, and a hydrochloric acid, or a mixed liquid of one of these acids with hydrogen peroxide solution. Through this process the front side ohmic electrodes 70 are formed.

Next, a metal layer containing Ni as a main component is formed on the back side being the second main face of the silicon carbide substrate 10, and then the thermal process is performed to form the back side ohmic electrode 71 on the back side of the silicon carbide substrate 10.

Then, a metal wiring such as Al is formed on the front side of the silicon carbide substrate 10 by a sputtering method or a vapor deposition method and then formed into a predetermined shape by photolithography, and thereby the source electrode 80 in contact with the front side ohmic electrodes 70, the gate pad and the gate wiring in contact with the gate electrode 60 are formed. Lastly, a drain electrode 81 is formed through the formation of a metal layer on the back side ohmic electrode 71 formed on the back side of the silicon carbide substrate 10, and thereby the silicon carbide semiconductor device as shown in FIG. 2(g) can be completed.

Through the process described above, the silicon carbide semiconductor device is manufactured.

Next, the effectiveness of the silicon carbide semiconductor device according to the configuration in Embodiment 1 of the present invention will be described.

As described above, the silicon carbide semiconductor device according to the present embodiment 1 includes the second well regions 31 in which the p-type impurity concentration is lower and the separation distance is larger, that is, smaller in width, than the first well regions 30, formed under the first well regions 30, and includes the highly concentrated JFET region 22 with highly concentrated n-type impurity inside the JFET region 21. In comparison with the conventional silicon carbide semiconductor device that is not provided with the second well regions 31 and the highly concentrated JFET region 22 described above, the effectiveness of the silicon carbide semiconductor according to Embodiment 1 of the present invention will be described.

Figure 3:
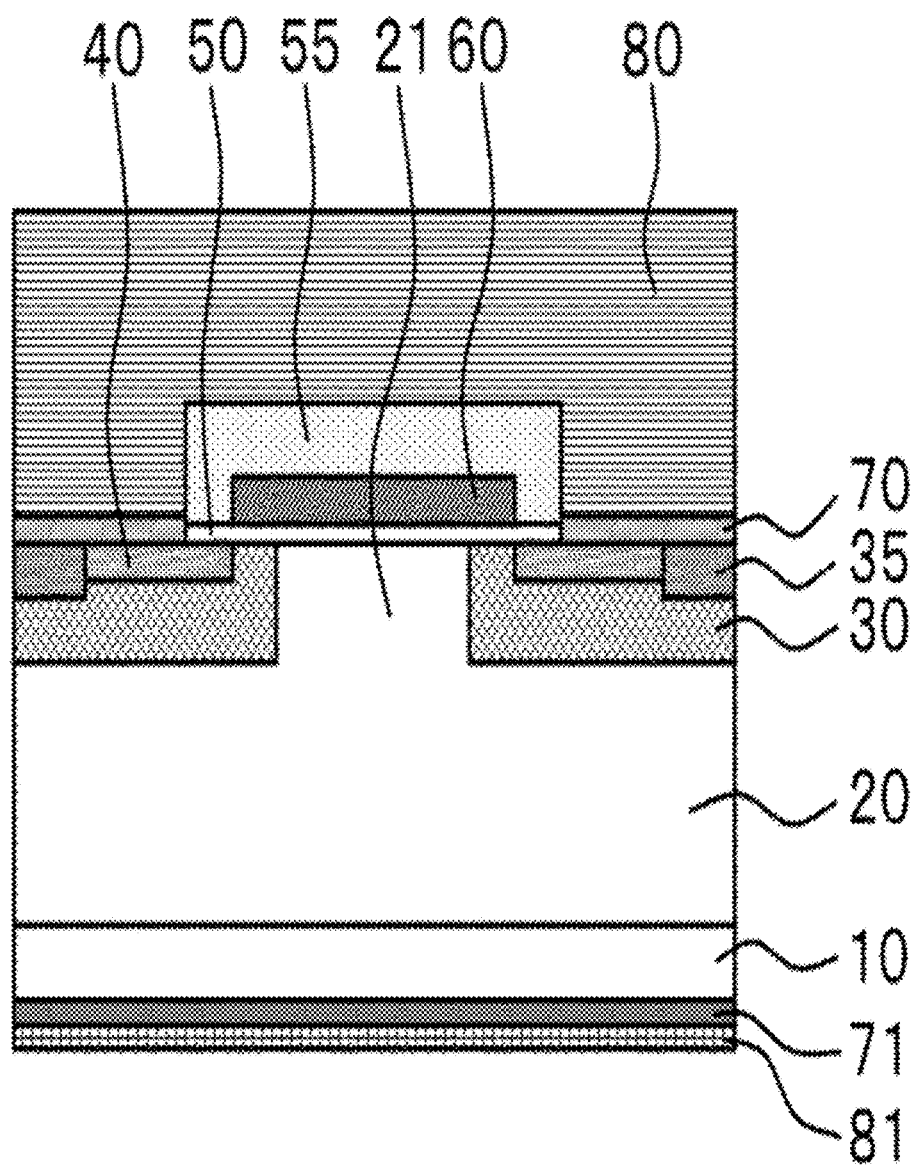
FIG. 3 is a schematic cross-sectional diagram showing a structure of a conventional silicon carbide semiconductor device.

FIG. 3 is a schematic cross-sectional diagram showing a structure of the conventional silicon carbide semiconductor device. The silicon carbide semiconductor device shown in FIG. 3 is a MOSFET similar to the silicon carbide semiconductor device according to the present invention shown in FIG. 1. In comparison with the silicon carbide semiconductor device according to the present invention, shown in FIG. 1, the conventional silicon carbide semiconductor device shown in FIG. 3 does not have the second well regions.

In the conventional silicon carbide semiconductor device shown in FIG. 3, there are following three general design methods for the reduction of the p-n junction electric field intensity between the silicon carbide drift layer 20 and the first well regions 30 in an off-state of the MOSFET. Firstly, the separation distance between adjacent first well regions 30 is made smaller. Secondly, the first well regions 30 are shallowly formed. Thirdly, the impurity concentration of the highly concentrated JFET region 22 disposed between the adjacent first well regions 30 is made low. However, in any of the cases described above, a design for the reduction of the p-n junction electric field intensity in the off state causes increase in the on-voltage in the on-state, and thus a trade-off exists between the reduction of the p-n junction electric field intensity and the reduction of the on-voltage.

Especially, in a low withstand voltage device such as a device with 600 V or 1200 V withstand voltage, voltage drop of the on-voltage in the JFET region 21 in the on state occupies a large part in the total voltage drop, thereby causing a power loss increase. In addition, because the impurity concentration in the drift layer is low in a high withstand voltage device such as a device with 3300 V or higher withstand voltage, the depletion layer in the region is widely expanded, so that the current path becomes narrower. Thus, the absolute value of the voltage drop becomes larger.

In contrast, in the silicon carbide semiconductor device according Embodiment 1 of the present invention, because the highly concentrated JFET region 22 in which the n-type impurity concentration is set higher than the silicon carbide drift, layer 20 is provided in the region 21, and the second well regions 31 are provided under the first well regions 30, the p-n junction electric field intensity in the off-state under the same on condition can be reduced, while the increase in the electric field intensity applied to the gate insulating film 50 is suppressed.

The effectiveness of the present, invention is quantitatively examined using a device simulation. The silicon carbide semiconductor device according to the present invention used for the device simulation is the same as shown in FIG. 1. Here, the conventional silicon carbide semiconductor device has the structure shown in. FIG. 3. In addition, it is assumed that the n-type impurity concentration of the JFET region 21 can be increased or decreased and the highly concentrated JFET region 22 can be provided in the JFET region 21. For the device simulation, both in the silicon carbide semiconductor device according to the present invention and the conventional silicon carbide semiconductor device, parameters such as the n-type impurity concentration of the JFET region 21, the separation distance of the first well regions, and the separation distance of the second well regions are adjusted so as to make the electric field intensity applied to the gate insulating film 50 be the same and constant. In the following description, the conventional silicon carbide semiconductor device shown in FIG. 3 is referred to as structure A and the silicon carbide semiconductor device according to the present invention shown in FIG. 1 is referred to as structure B.

First, the ret between the p-n junction electric field intensity in the off-state and the on-voltage in the on-state is examined.

In the conventional silicon carbide semiconductor device of the structure A, in order to reduce the p-n junction electric field intensity, the first well regions 30 need to be shallowly formed as described above. Here, in order to keep the electric field applied to the gate insulating film 50 constant, the n-type impurity concentration of JFET region 21 is reduced in accordance with the reduction in depth of the first well regions. In other words, in the case where the electric field intensity applied to the gate insulating film 50 is kept constant, the relationship between the p-n junction electric field intensity and the on-voltage is examined. In contrast, in the silicon carbide semiconductor device of the structure B according to the present invention, the second well regions 31 are formed and the n-type impurity concentration in the highly concentrated JFET region 22 is made higher than the silicon carbide drift layer 20, and then the relationship between the p-n junction electric field intensity and the on-voltage is examined in the case where the electric field intensity applied to the gate insulating film 50 is kept constant.

Both in the conventional silicon carbide semiconductor device of the structure A and the silicon carbide semiconductor device of the structure B according to the present invention, the separation distance of the first well regions 30 is set to be 1.4 µm and the electric field intensity applied to the gate insulating film 50 is set to a constant value of 2 MVcm when the drain voltage is 600V. Further, in the silicon carbide semiconductor device of the structure B according to the present invention, the width of the second well regions 31 is smaller than the width of the first well regions 30, namely the separation distance of the second well regions 31 is larger. The width of the implantation mask for the second well regions 31 is made larger than the width of the implantation mask of the first well regions 30 by 0.4 µm to 0.7 µm at each of the regions. In other words, the separation distance of the second well regions 31 is changed in the range between 2.2 µm and 2.8 µm.

Figure 4:
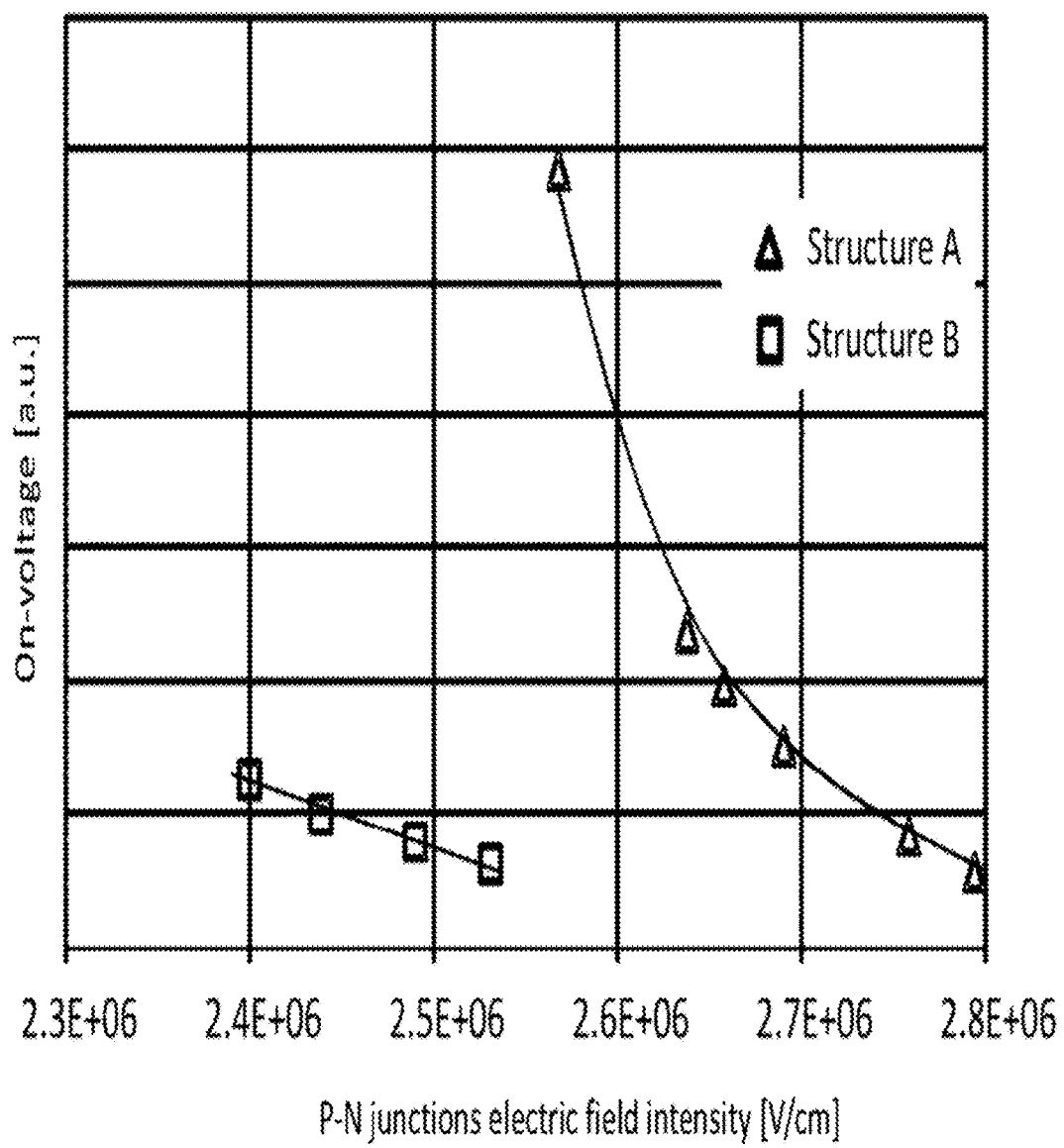
FIG. 4 is a graph showing the relationship between p-n junction electric field intensity and on-voltage in the conventional silicon carbide semiconductor device and in the silicon carbide semiconductor device according to the present invention.

FIG. 4 is a graph showing the relationship between the p-n Junction electric field intensity and the on-voltage calculated by the device simulation for the conventional silicon carbide semiconductor device and the silicon carbide semiconductor device according to the present invention. In FIG. 4, the calculation result for the conventional silicon carbide semiconductor device of the structure A is indicated by triangle marks and the calculation result for the silicon carbide semiconductor device of the structure B according to the present invention is indicated by rectangle marks. From FIG. 4, in the conventional silicon carbide semiconductor device of the structure A, the on-voltage is sharply increased in accordance with the reduction of the p-n junction electric field intensity caused by decreasing the depth in the formation of the first well regions 30, whereas in the silicon carbide semiconductor device of the structure B according to the present invention, in comparison with the conventional silicon carbide semiconductor device of the structure A, it is understood that the on-voltage gradually increased in accordance with the reduction of the p-n junction electric field intensity caused decreasing the separation distance of the second well regions 31. And furthermore, in the silicon carbide semiconductor device of the structure B according to the present invention, it is understood that the p-n junction electric field intensity is reduced by about 0.3 MVcm when the same on-voltage as the conventional silicon carbide semiconductor device of the structure A is obtained.

Figure 5:
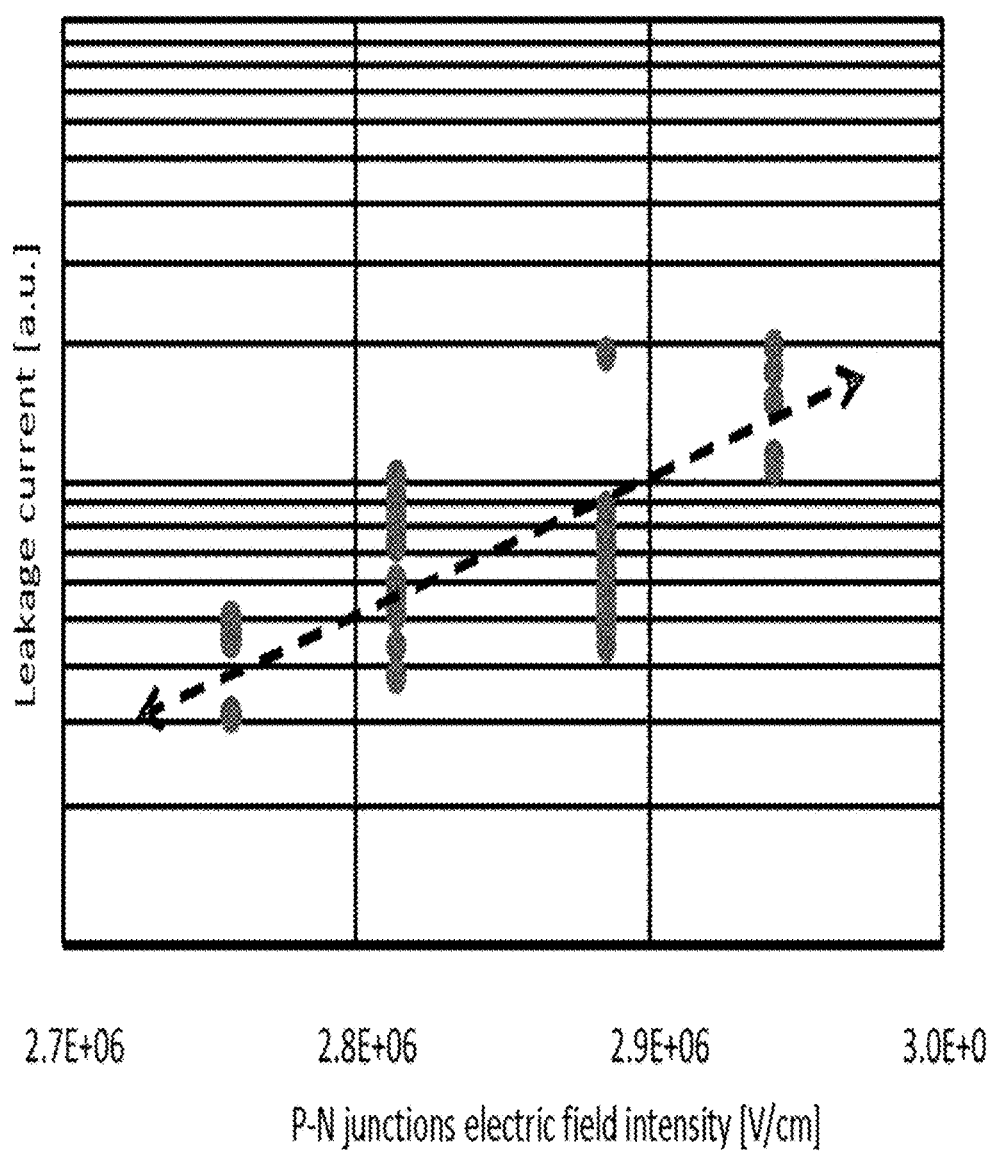
FIG. 5 is a graph showing the measurement result of leakage current versus p-n junction electric field intensity in an off-state of the silicon carbide semiconductor device.

FIG. 5 is a graph showing the measurement result of the leakage current with respect to the p-n junction electric field intensity in the off-state of the silicon carbide semiconductor device. FIG. 5 shows the measurement result obtained by using an actual prototype of the silicon carbide semiconductor device. The horizontal axis represents the p-n junction electric field intensity in the off-state calculated on the basis of the design and the vertical axis represents the actual measurement value of the leakage current in the off-state in a logarithmic representation. From FIG. 5, it is understood that the leakage current logarithmically increases with the increase in the p-n junction electric field intensity, and 0.3 MVcm reduction in the p-n junction electric field intensity enables the reduction by about one order of magnitude in the leakage current in the off-state. Namely, the silicon carbide semiconductor device according to the present invention can reduce the p-n junction electric field intensity by about 0.3 MVcm under the same on-voltage as the conventional silicon carbide semiconductor device, so that the leakage current can be reduced by about one order of magnitude. This brings about an effect of significant improvement in the reliability of the silicon carbide semiconductor device.

FIG. 6 is diagrams showing electric field intensity distributions in the cross sections of the conventional silicon carbide semiconductor device and the silicon carbide semiconductor device according to the present invention. FIG. 6(a) is for the conventional silicon carbide semiconductor device of the structure A and FIG. 6(b) is for the silicon carbide semiconductor device of the structure B according to the present invention. The figures are the contour diagrams of the electric field intensity distributions calculated by the device simulation in a case where 1200V drain voltage is applied to the respective MOSFETs of the structure A and the structure B that are in the off-state. As understood from the comparison between FIG. 6(a) and FIG. 6(b), in the conventional silicon carbide semiconductor device shown in FIG. 6(a), the region with large electric field intensity is concentrated around an edge of a first well region 30, whereas in the silicon carbide semiconductor device according to the present invention shown in FIG. 6(b), because a second well region 31 is provided, the region with large electric field intensity is concentrated around each of the edges in the first well region 30 and the second well region 31. As a result, in the silicon carbide semiconductor device according to the present invention, the value of the p-n junction electric field intensity under the drain voltage application is reduced and the off-state leakage current is reduced.

Figure 7:
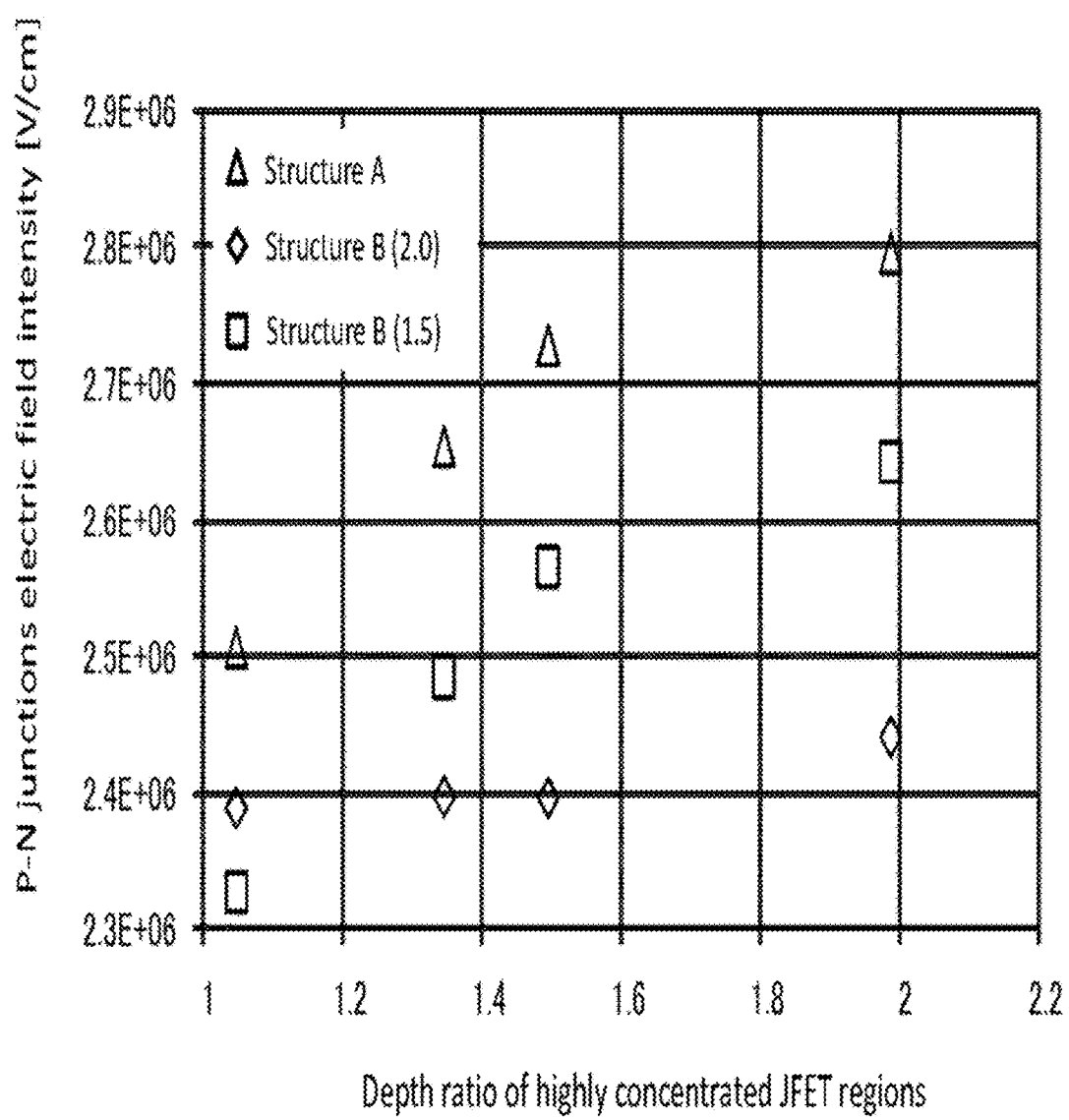
FIG. 7 is a graph showing the relationship between depth ratio for a highly concentrated JFET region and the p-n junction electric field intensity.
Figure 8:
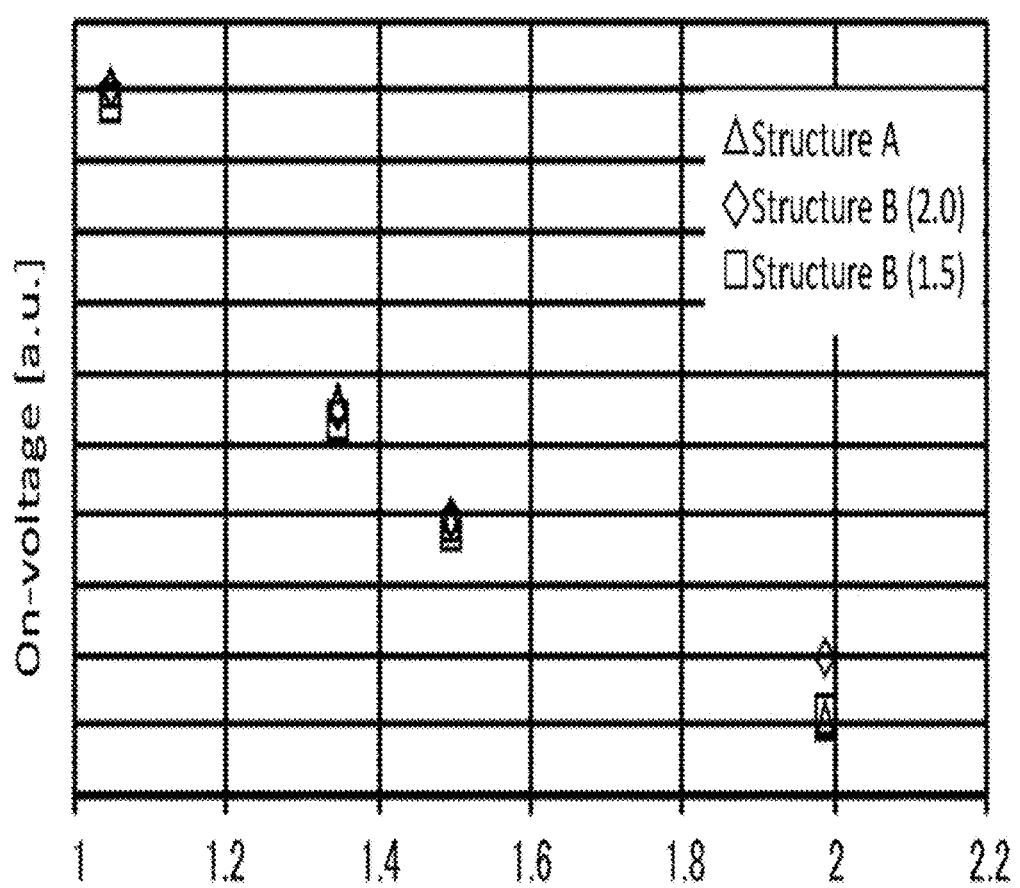
FIG. 8 is a graph showing the relationship between depth ratio of the highly concentrated JFET region and the on-voltage.

Next, the effect of the thickness of the highly concentrated JFET region 22 within the JFET region 21 on the p-n junction electric field intensity and the on-voltage is calculated by the device simulation. FIG. 7 is the calculation result showing the relationship between the depth ratio of the highly concentrated JFET region and the p-n junction electric field intensity. FIG. 8 is the calculation result showing the relationship between the depth ratio of the highly concentrated JFET region and the on-voltage. In FIG. 7 and FIG. 8, the horizontal axis represents the depth ratio of the highly concentrated JFET region, which is the thickness of the highly concentrated JFET region 22 divided by the depth of the first well regions 30. That is, the thickness of the highly concentrated JFET region 22 with respect to the depth of the first well regions 30 is defined as the depth ratio of the highly concentrated region 22. Therefore, the calculation results in the range from 1 to 2 in the horizontal axis are shown in FIG. 7 and FIG. 8, and thus the calculation results in which the thickness of the highly concentrated JFET region. 22 is more than one time and less than two times the depth of the first well regions 30 are shown.

Note that in this verification, also in the conventional silicon carbide semiconductor device of the structure A, the highly concentrated region 22 is provided by increasing the n-type impurity concentration in the JFET region In addition, in FIG. 7 and FIG. 8, regarding the silicon carbide semiconductor device of the structure B according to the present invention, the calculation results in which the depth ratio of the second well regions 31 to the first well regions 30 is changed for two cases are also shown. The ratios are indicated in parentheses in the legends of FIG. 7 and FIG. 8. To be specific, the simulations are carried out in cases where the values resulting from dividing the depth of the second well regions 31 by the depth of the first well regions 30 are 2.0 and 1.5.

Note that the depths of the first well regions 30 and the second well regions 31 referred to here mean the depths from the top face of the silicon carbide drift layer 20. The case in which the depth ratio of the second well regions 31 to the depth of the first well regions 30 is 2.0 means that the first well regions 30 and the second well regions 31 are of the same thickness. Further, the case in which the depth ratio of the second well regions 31 to the depth of the first well regions 30 is 2.0 and the depth ratio of the highly concentrated JFET region 22 indicated in the horizontal axes of FIG. 7 and FIG. 8 is 2.0 means that the thickness of the well regions joined by the first well regions 30 and the second well regions 31 is the same as the thickness of the highly concentrated JFET region 22.

In the device simulation by which the results of FIG. 7 and FIG. 8 are obtained, the width of the second well regions 31 is set less than the width of the first well regions 30 as shown in FIG. 1. Namely, the separation distance W2 of the second well regions 31 is larger than the separation distance W1 of the first well regions 30, and thus the implantation mask width for forming the second well regions 31 is made larger by 0.5 μm in one side than the implantation mask width for forming the first well regions 30.

Further, in each of three cases in total including one case for the conventional silicon carbide semiconductor device of the structure A and two cases for the silicon carbide semiconductor device of the structure B according to the present invention, the n-type impurity concentration of the highly concentrated JFET region 22 was adjusted so as for the electric field intensity applied to the gate insulating film 50 to be constant at 2 MVcm under 600V drain voltage application in the off-state.

As shown in FIG. 7, the p-n junction electric field intensity becomes larger as the depth ratio of the highly concentrated JFET region 22 becomes larger. In the silicon carbide semiconductor devices of the structure B according to the present invention, the p-n junction electric field intensity is smaller than that of the conventional silicon carbide semiconductor device of the structure A. Particularly, in the case where the depth ratio of the second well regions 31 to the depth of the first well regions 30 is 2.0, the p-n junction electric field intensity can be further reduced in comparison with the case of 1.5. Thus, it can be understood that the larger depth ratio of the second well regions 31 to the depth of the first well regions 30 is preferable.

Meanwhile, as shown in FIG. 8, the on-voltage becomes smaller as the depth ratio of the highly concentrated JFET region 22 becomes larger. The difference in the on-voltage among the conventional silicon carbide semiconductor device of the structure A and the silicon carbide semiconductor devices of the structure B according to the present invention is small and negligible. From the results shown in FIG. 7 and FIG. 8 it can be understood that, when compared with the conventional semiconductor device of the structure A, the silicon carbide semiconductor devices of the structure B according to the present invention can reduce the p-n junction electric field intensity without increasing the on-voltage.

Figure 9:
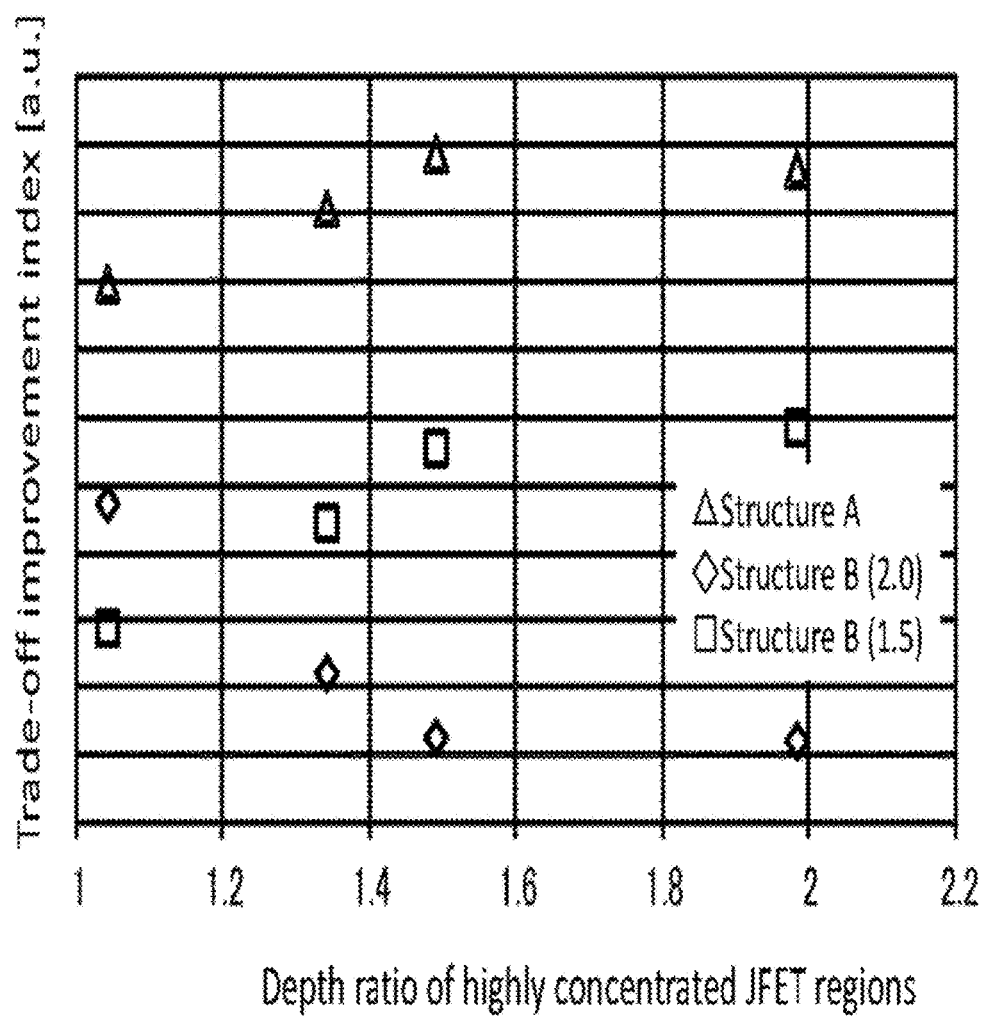
FIG. 9 is a graph showing the relationship between depth ratio of the highly concentrated JFET region and a trade-off improvement index for the p-n junction and the on-voltage.

FIG. 9 is a graph showing the relationship between the depth ratio of the highly concentrated JFET region and a trade-off improvement index for the p-n junction electric field and the on-voltage. The trade-off improvement index in the vertical axis of FIG. 9 is a product of the p-n junction electric field intensity in the vertical axis of FIG. 7 and the on-voltage in the vertical axis of FIG. 8. That is, FIG. 9 shows that the smaller the index value in the vertical axis is, the larger the effect in reducing the p-n junction electric field intensity and the on-voltage is. Thus, the index can be useful in designing the silicon carbide semiconductor device. To be more specific, in a case where a structure with a smaller trade-off improvement index is chosen, under the same n-voltage, the p-n junction electric field intensity can be further reduced, and under the same p-n junction electric field intensity, the on-voltage can be further reduced.

As shown in FIG. 9, the trade-off improvement index is the smallest in the silicon carbide semiconductor device of the structure B (2.0) plotted with diamond marks in the present invention, and it is understood that the largest effect can be achieved in reducing p-n junction electric field intensity and the on-voltage. Next to the above, the silicon carbide semiconductor device of the structure B (1.5) plotted with rectangle marks in the present invention has the second smallest, and the conventional silicon carbide semiconductor device of the structure A plotted with triangle marks has the largest. Namely, it can be understood that within the range where the thickness of the highly concentrated JFET region 22 is larger than one time and less than two times the depth of the first, well regions 30, the silicon carbide semiconductor device of the structure B according to the present invention has larger effect in the reduction of the p-n junction electric field intensity and the on-voltage than the conventional silicon carbide semiconductor device of the structure A and is preferable. In addition, it can be understood that the larger depth of the second well regions 31 with respect to the depth of the first well regions 30 is more effective and preferable in the reduction of the p-n junction electric field intensity and the on-voltage.

Next, the relationship among the distance $d_{1-2}$ from the end of the first well region 30 to the end of the second well, region 31, p-n junction electric field intensity in the off-state, and the on-voltage in the on-state is examined by the device simulation. In the device simulation, as shown in FIG. 6, the calculation is performed for half of the entire silicon carbide semiconductor device, assuming that the device is symmetric with respect to a line. Therefore, the distance $d_{1-2}$ between the end of the first well region 30 and the end of the second well region 31 is the same on both sides of the symmetry line. As the distance $d_{1-2}$ between the end of the first well region 30 and the end of the second well region 31, a half of the difference between the width $2d_1$ of the implantation mask for forming the first well regions 30 and the width $2d_2$ of the implantation mask for forming the first well regions 31 is used as $d_{1-2}$. Namely, $d_{1-2}=d_1-d_2$. Note that, $d_1$ and $d_2$ each are a half of the width for each of the implantation masks. The width of each of the implantation masks is almost equal to each of the separation distances in the first well regions 30 adjacent to each other and in the second well regions 31 adjacent to each other, and the distance $d_{1-2}$ is almost equal to the half of the difference between the separation distance of the first well regions 30 and the separation distance of the second well regions 31, The silicon carbide semiconductor device is configured such that a plurality of structures shown in the cross-section of FIG. 1 or FIG. 3 is disposed side by side in the lateral direction. Therefore, a half of the difference between the width $2d_1$ of the implantation mask for forming the first well regions 30 and the width $2d_2$ of the implantation mask for forming the second well regions 31 is almost equal to a value obtained by multiplying the difference between the width of the first well regions 30 and the width of the second well regions 31 by −½. Therefore, the value obtained by multiplying the difference $2d_1-2d_2$ between the widths of the implantation masks by −½ can be defined as the distance between the end of the first well region 30 and the end of the second well region 31.

Hereinafter, when the distance $d_{1-2}$ is zero, it means that, the width $2d_1$ of the implantation mask for forming the first well regions 30 is equal to the width $2d_2$ of the implantation mask for forming the first well regions 31. Further, when the distance $d_{1-2}$ takes a negative value, it means that the width of the implantation mask for forming the first well regions 30 is smaller than the width $2d_2$ of the implantation mask for forming the first well regions 31, the separation distance W1 of the first well regions 30 is smaller than the separation distance W2 of the second well regions 31, and the width of the first well regions 30 is larger than the width of the second well regions 31.

In this verification, the n-type impurity concentration of the highly concentrated JFET region 22 is adjusted so that the electric field intensity applied to the gate insulating film 50 will be constant at 2 MVcm under 600V drain voltage application in the off-state.

Figure 10:
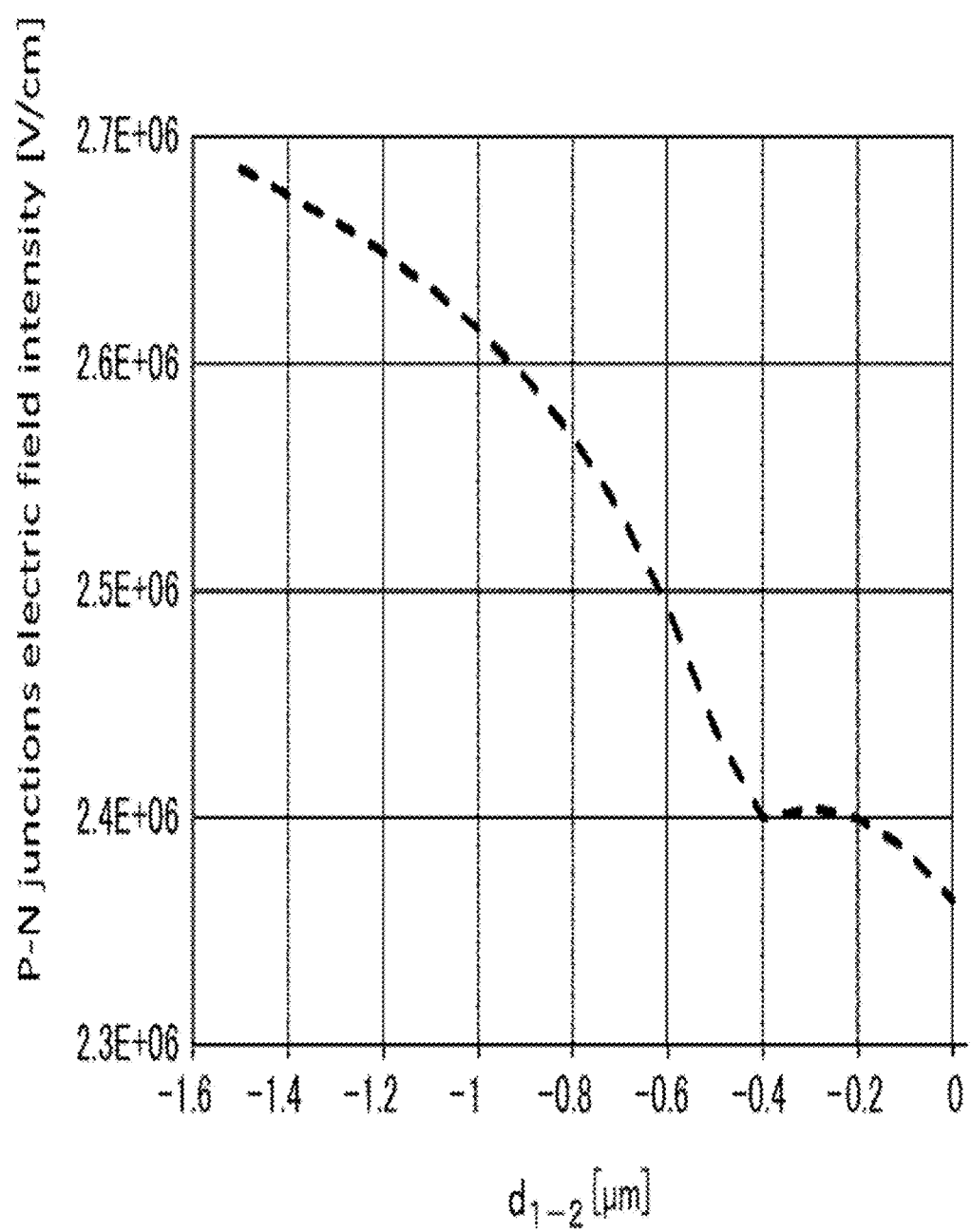
FIG. 10 is a graph showing the p-n junction electric field intensity in relation to the distance $d_{1-2}$ between an end of a first well region and an end of a second well region in the silicon carbide semiconductor device according to Embodiment 1 of the present invention.

FIG. 10 is a graph showing the p-n junction electric field intensity in relation to the distance $d_{1-2}$ between the end of the first well region and the end of the second well region in the silicon carbide semiconductor device of the structure B according to the present invention. In FIG. 10, the horizontal axis represents the distance $d_{1-2}$ calculated as a half of the difference between the width $2d_1$ of the implantation mask for forming the first well regions 30 and the width $2d_2$ of the implantation mask for forming the first well regions 31. The distance $d_{1-2}$ is almost equal to a half of the difference between the separation distance W1 of the first well regions 30 and the separation distance W2 of the second well regions 31, and thus is regarded as ½ of the difference between the separation distances. The value in the horizontal axis multiplied by −2 can be regarded as the difference between the width of the first well regions 30 and the width of the second well regions 31. In addition, the vertical axis in FIG. 10 is the p-n junction electric field intensity in the off-state.

As can be understood from FIG. 10, within the range where the distance $d_{1-2}$ is equal to or larger than −0.4 μm, namely in the range from −0.4 μm to 0 μm, the change in the p-n junction electric field intensity depending on the change in the distance $d_{1-2}$ is small, and thus in the design to adjust the p-n junction electric field intensity by changing the difference between the width of the first well regions 30 and the width of the second well regions 31, the p-n junction electric field intensity cannot be changed significantly, and the degree of design freedom is small.

In contrast, it can be understood that in the range of the distance $d_{1-2}$ less than −0.4 μm, the smaller the distance $d_{1-2}$ is, namely the larger the absolute value of the difference between the width of the first well regions 30 and the width of the second well regions 31 is, the larger the p-n junction electric field intensity is. This indicates that the p-n junction electric field intensity can be adjusted by changing the difference between the width of the first well regions 30 and the width of the second well regions 31, and this is favorable in the aspect of widening the degree of design freedom.

Figure 11:
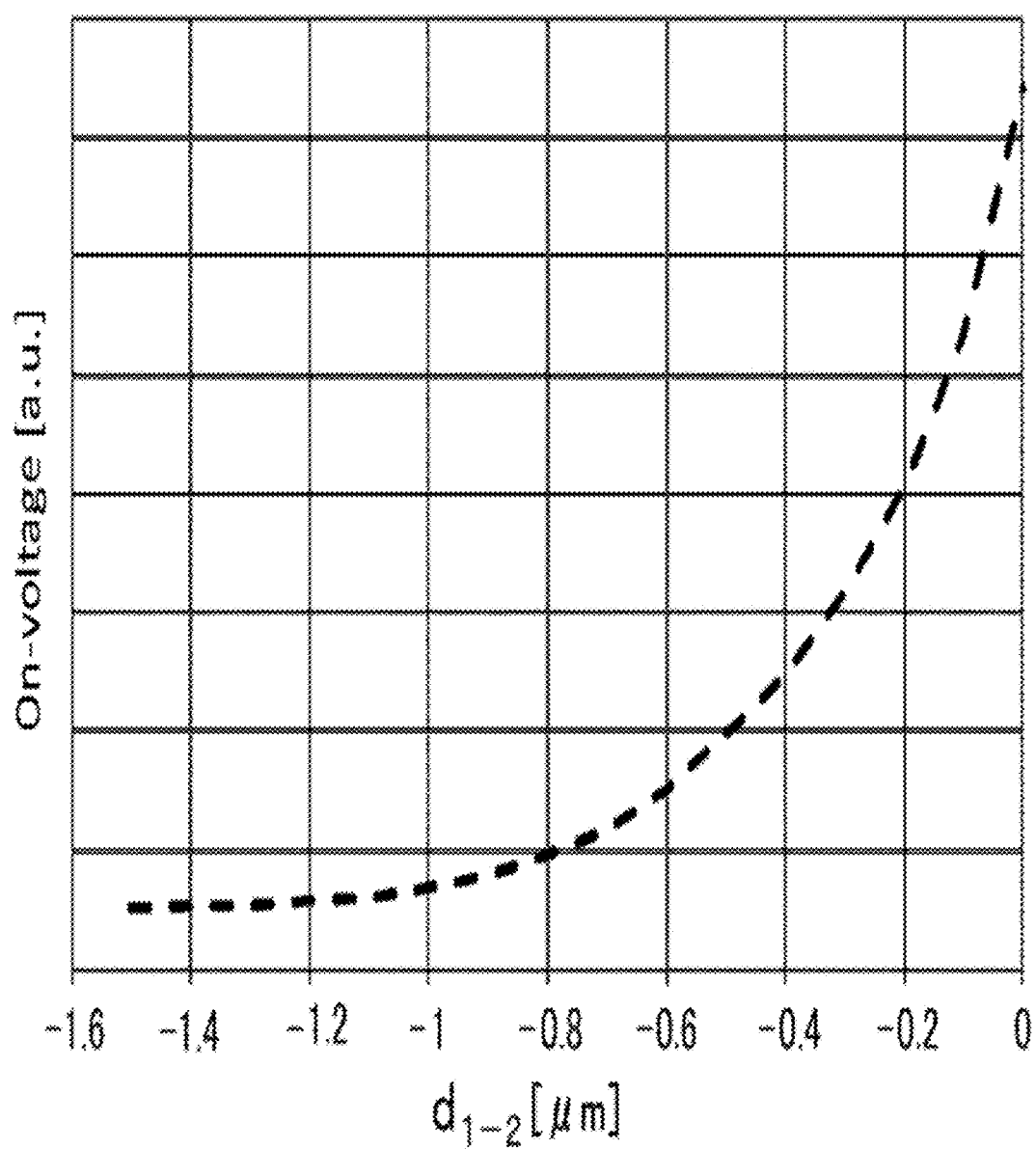
FIG. 11 is a graph showing the on-voltage in an on-state in relation to the distance $d_{1-2}$ between the end of the first well region and the end of the second well region in the silicon carbide semiconductor device according to Embodiment 1 of the present invention.

FIG. 11 is a graph showing the on-voltage in the on-state in relation to the distance $d_{1-2}$ between the end of the first well region and the end of the second well region in the silicon carbide semiconductor device of the structure B according to the present invention. The horizontal axis in. FIG. 11 is the same as that in FIG. 10. As can be understood from FIG. 11, the smaller the distance $d_{1-2}$ is, namely the larger the absolute value of the distance $d_{1-2}$ is, the smaller the on-voltage is.

Figure 12:
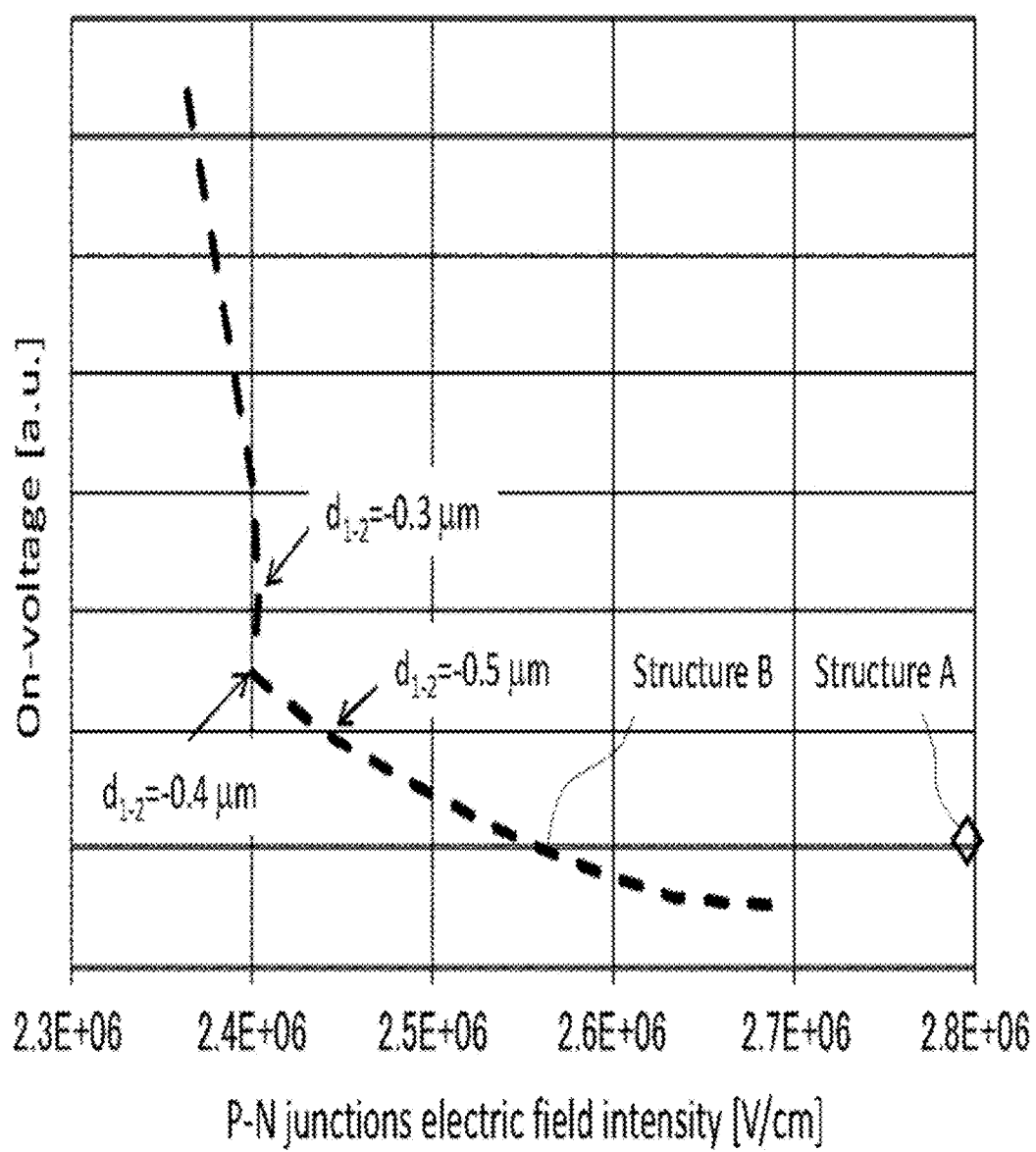
FIG. 12 is a graph showing the relationship between the p-n junction electric field intensity and the on voltage in the silicon carbide semiconductor device according to the present invention and in the conventional silicon carbide semiconductor device.

FIG. 12 is a graph showing the relationship between the p-n junction electric field intensity and the on-voltage, which is obtained from the calculation result shown in FIG. 10 and FIG. 11. The horizontal axis in FIG. 12 represents the p-n junction electric field intensity shown in the vertical axis in FIG. 10 and the vertical axis in FIG. 12 represents the on-voltage shown in the vertical axis in FIG. 11. In FIG. 12, the calculation result of the silicon carbide semiconductor device of the structure B according to the present invention is indicated by a broken line and the calculation result of the conventional silicon carbide semiconductor device of the structure A is indicated by a diamond mark. Since the second well regions are not provided in the conventional silicon carbide semiconductor device of the structure A, the difference between the width of the first well regions and the width of the second well regions is zero, and since there is only one calculation point at the zero difference, the only one point is shown in FIG. 12.

In the calculation result of the silicon carbide semiconductor device of the structure B according to the present invention shown by a broken line in FIG. 12, points are indicated in cases where the respective distances $d_{1-2}$ are −0.3 μm, −0.4 μm, and −0.5 μm. As the distance $d_{1-2}$ becomes larger than −0.3 μm, namely, as the absolute value of the distance $d_{1-2}$ becomes smaller the broken line indicating the calculation result extends toward the upper left of the FIG. 12. As the distance $d_{1-2}$ becomes smaller than −0.5 μm, namely, as the absolute value of the distance $d_{1-2}$ becomes larger, the broken line indicating the calculation result extends toward the lower right of the FIG. 12.

As indicated by the calculation result shown with the broken line in FIG. 12, it can be understood that the characteristics of the silicon carbide semiconductor device of the structure B according to the present invention changes significantly before and after the point where the distance $d_{1-2}$ is −0.4 μm. That is, in the case where the absolute value of the distance is smaller than 0.4 μm, the p-n junction electric field intensity changes little, but as the absolute value of the distance $d_{1-2}$ becomes the on-voltage becomes larger. Thus, it can be understood that the trade-off relationship between the p-n junction electric field intensity and the on-voltage is lost. In contrast, in the case where the absolute value of the distance $d_{1-2}$ is larger than 0.4 μm, as the absolute value of the distance becomes larger, the p-n junction electric field intensity becomes larger. Thus, it can be understood that the trade-off relationship between the p-n junction electric field intensity and the on-voltage is maintained.

As described above, from the verification results in FIG. 4 and from FIG. 7 to FIG. 9, in comparison with the conventional silicon carbide semiconductor device, the silicon carbide semiconductor device according to the present invention can reduce the p-n junction electric field intensity under the same on-voltage, while maintaining the trade-off relationship between the p-n junction electric field intensity and the on-voltage. This is due to the fact that, in the verification in FIG. 4 and from FIG. 7 to FIG. 9, the separation distance W2 between the second well regions 31 in the silicon carbide semiconductor device according to the present invention is larger than the separation distance W1 between the first well regions 30 by 0.8 μm or more.

However, as shown in the verification results in FIG. 10 to FIG. 12, in the silicon carbide semiconductor device according to the present invention, when the difference between the separation distance W2 of the second well regions 31 and the separation distance W1 of the first well regions 30 becomes smaller than 0.8 μm, namely when the absolute value of the distance $d_{1-2}$ is smaller than 0.4 μm, the trade-off relationship between the p-n junction electric field intensity and the on-voltage is lost. For example, a problem sometimes arises in that a device in which the on-voltage is reduced to a desired value or lower cannot be designed. That is, when the separation distance W1 of the first well regions 30 is set smaller than the separation distance W2 of the second well regions 31 by 0.8 μm or more, in other words, when the width of the first well regions 30 is set larger than the width of the second well regions 31 by 0.8 μm or more, the degree of freedom can be enhanced in the design of the silicon carbide semiconductor device in which the trade-off improvement index represented by the product of the p-n junction electric field intensity and the on-voltage is suppressed low while the trade-off relationship between the p-n junction electric field intensity and the on-voltage is maintained.

When the calculation results shown in FIG. 12 are compared between the conventional silicon carbide semiconductor device of the structure A and the silicon carbide semiconductor device of the structure B according to the present invention, it can be understood that the p-n junction electric field in the silicon carbide semiconductor device of the structure B according to the present invention can be reduced approximately by 0.23 MVcm even under the same on-voltage, and the leakage current can be reduced as shown in FIG. 5.

Next, the relationship between the p-type impurity concentration of the first, well regions 30 and the p-type impurity concentration of the second well regions 31, in other words, the relationship between the implantation dose amount of the p-type impurity in forming the first well regions 30 and the implantation dose amount of the p-type impurity in forming the second well regions 31 is verified. The value obtained by dividing the p-type concentration of the first well regions 30 by the p-type impurity concentration of the second well regions 31 namely, the ratio of the p-type impurity concentration of the first well regions 30 to the p-type impurity concentration of the second well regions 31 is set as γ. The p-n junction electric field in the off-state and the on-voltage in the on-state when γ is changed are calculated by the device simulation.

Figure 13:
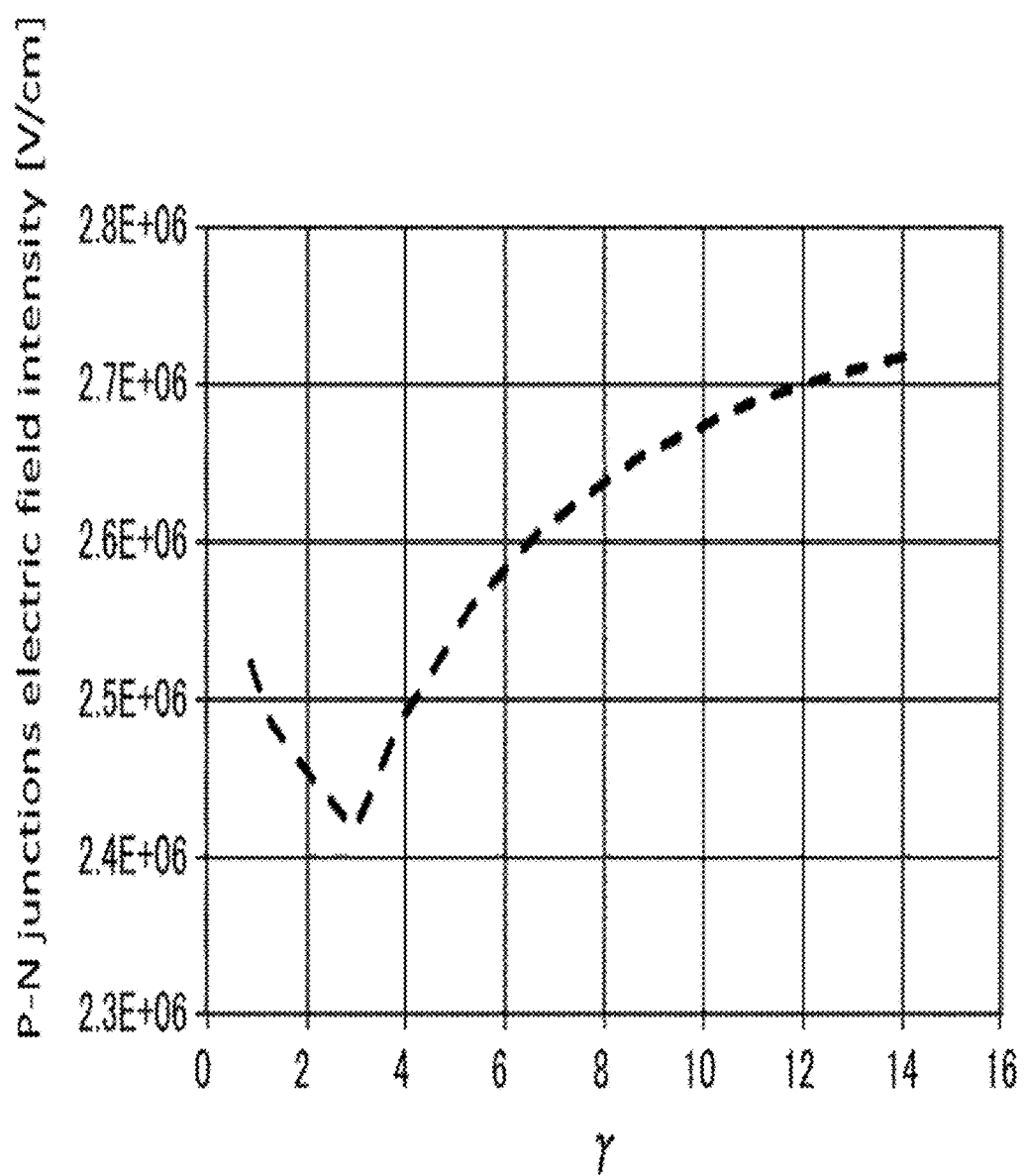
FIG. 13 is a graph showing the relationship between the ratio γ of a p-type impurity concentration of first well regions to a p-type impurity concentration of the second well regions and the p-n junction electric field intensity in the silicon carbide semiconductor device according to Embodiment 1 of the present invention.
Figure 14:
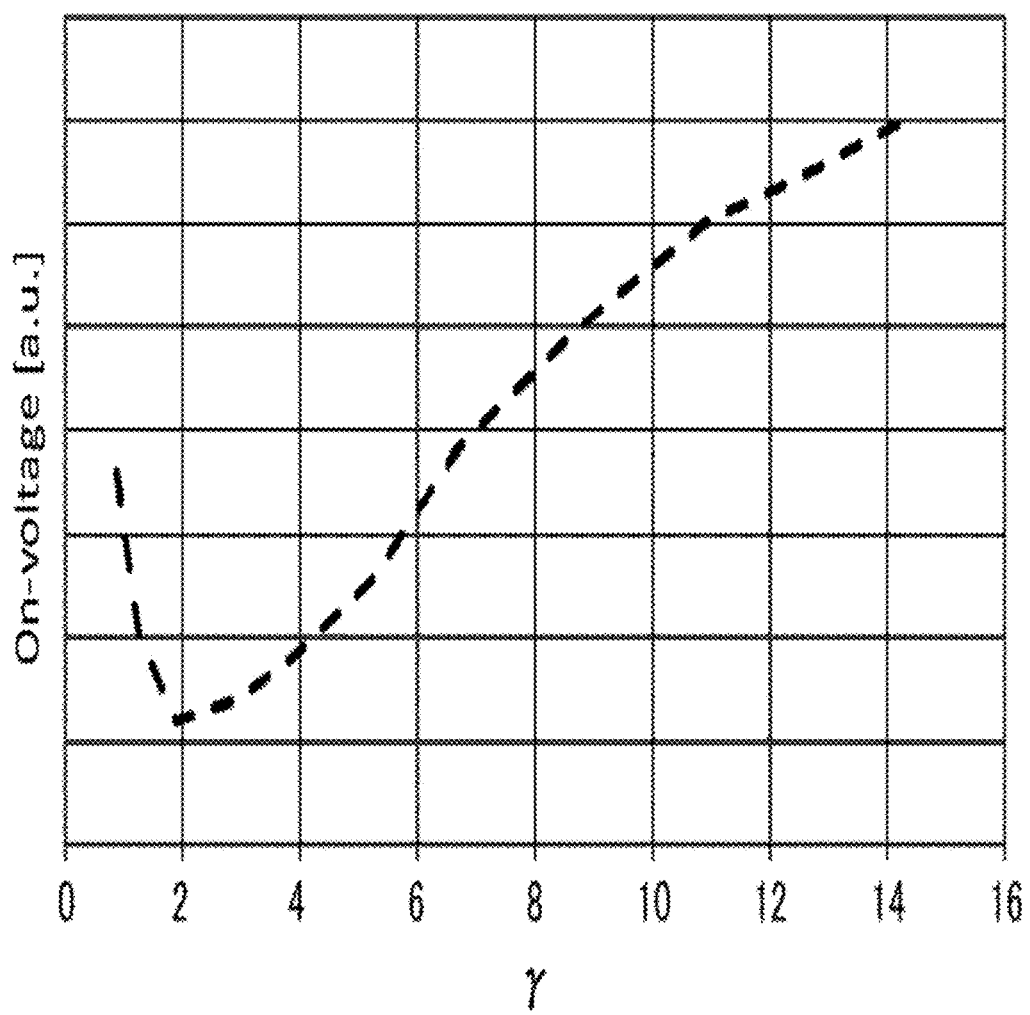
FIG. 14 is a graph showing the relationship between the ratio γ of the p-type impurity concentration of the first well regions to the p-type impurity concentration of the second well regions and the on-voltage in the silicon carbide semiconductor device according to Embodiment 1 of the present invention.

FIG. 13 is a graph showing the relationship between the ratio γ of the p-type impurity concentration of the first well regions to that of the second well regions and the p-n junction electric field intensity. FIG. 14 is a graph showing the relationship between the ratio γ of the p-type impurity concentration of the first well regions to that of the second well regions and the on-voltage As shown in FIG. 13, the p-n junction electric field intensity takes its minimum value at around γ=3 and is equal to or smaller than 2.5 MVcm in the range of γ from 1.1 to 4.2. On the other hand, as shown in FIG. 14, the on-voltage takes its minimum value at around γ=1.8 and is small in the range of γ from 1.1 to 5.3. Further, within the range of γ from 1.3 to 4.2, the on-voltage is sufficiently small.

From FIG. 13, the p-n junction electric field intensity at γ=1.8 at which the on-voltage takes its minimum value is 2.46 MVcm, and from FIG. 13, γ at which the p-n junction electric field is equal to or smaller than 2.46 MVcm is in the range from 1.8 to 3.6. Referring back to FIG. 14, it can be seen that the on-voltage in the range of γ from 1.8 to 3.6 is sufficiently small and preferable.

Since it is preferable that both of the p-n junction electric field intensity and the on-voltage are small, as shown above, the ratio γ of the p-type impurity concentration of the first well regions 30 to that of the second well regions 31 in the range from 1.1 to 4.2 is preferable, and the ratio γ in the range from 1.8 to 3.6 is more preferable. When a ratio is defined with respect to the first well regions 30, ratio 1γ of the p-type impurity concentration of the second well regions 31 to that of the first well regions 30 in the range from 0.23 to 0.91 is preferable, and the ratio 1γ in the range from 0.27 to 0.56 is more preferable. In other words, the Al impurity concentration ion-implanted in the second well regions 31 is preferable in the range from 0.23 times to 0.91 times that in the first well regions 30. The range from 0.27 times to 0.56 times is more preferable. The range described above is an appropriate range of 1γ obtained from the result of the device simulation. In consideration of an influence from a manufacturing error in the actual silicon carbide semiconductor device, it is preferable that the Al impurity concentration ion-implanted in the second well regions 31 be in tile range from 0.2 times to 0.95 times the impurity concentration in the first well regions 30. The range from 0.25 times to 0.6 times is more preferable.

Figure 15:
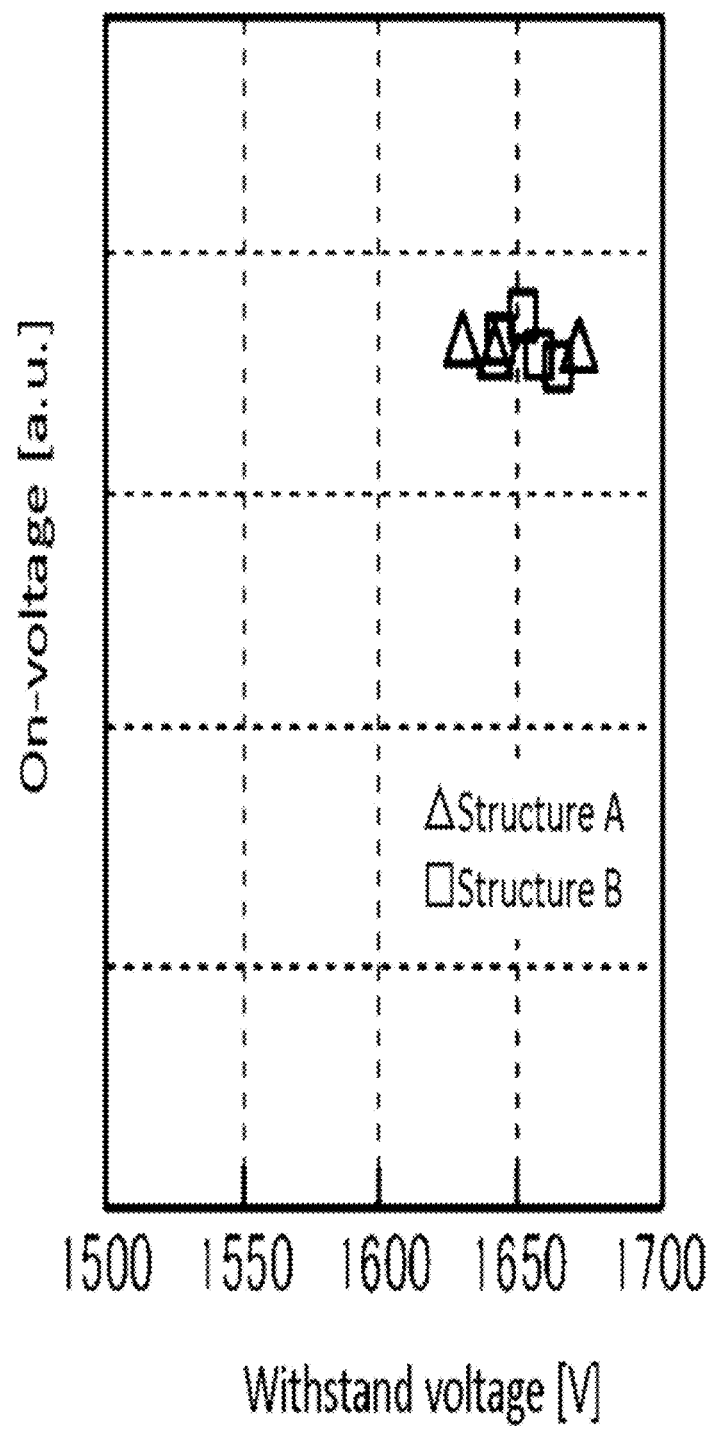
FIG. 15 is a graph showing the relationship between withstand voltage and the on-voltage in the silicon carbide semiconductor device according to Embodiment 1 of the present invention and the conventional silicon carbide semiconductor device.

FIG. 15 is a graph showing the relationship between the withstand voltage and the on-voltage in the silicon carbide semiconductor device according to Embodiment 1 of the present invention and in the conventional silicon carbide semiconductor device. In FIG. 15, triangle marks indicated for the structure A are the measurement results of the manufactured conventional silicon carbide semiconductor devices and rectangle marks indicated for the structure B are the measurement results of the manufactured silicon carbide semiconductor devices according to the present invention. As shown in FIG. 15, it can be seen that, as for the withstand voltage and the on-voltage, the conventional silicon carbide semiconductor device of the structure A and the silicon carbide semiconductor device of the structure B according to the present invention have comparable voltages.

Figure 16:
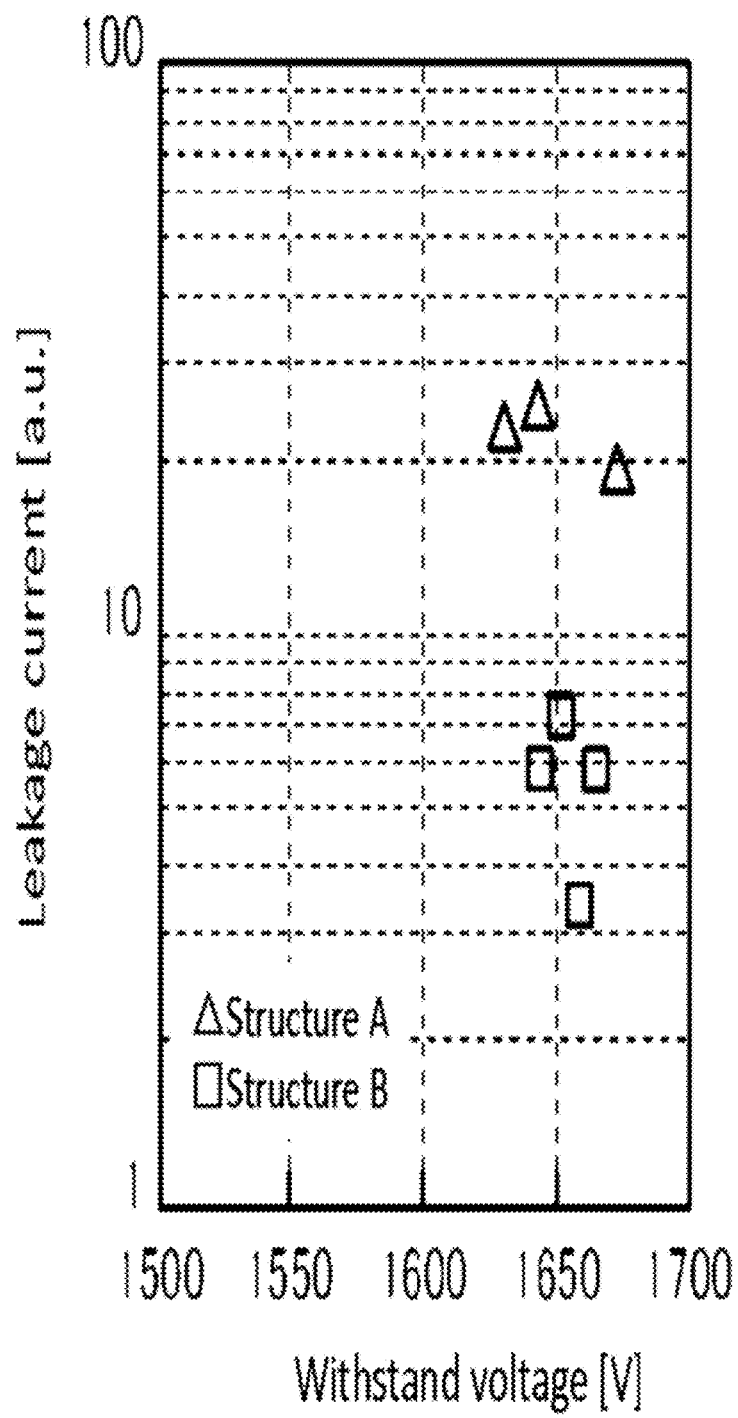
FIG. 16 a graph showing the relationship between the withstand voltage and the leakage current in the silicon carbide semiconductor device according to Embodiment 1 of the present invention and the conventional silicon carbide semiconductor device.

FIG. 16 is a graph showing the relationship between the withstand voltage and the leakage current in the silicon carbide semiconductor device according to Embodiment 1 of the present invention and the conventional silicon carbide semiconductor device. In FIG. 16, the triangle marks indicated for the structure A are the measurement results of the manufactured conventional silicon carbide semiconductor device and the rectangle marks indicated for the structure B are the measurement results of the manufactured silicon carbide semiconductor device according to the present invention. As shown FIG. 16, it can be seen that the silicon carbide semiconductor device of the structure B according to the present invention can reduce the leakage current, while maintaining the withstand voltage comparable to that in the conventional silicon carbide semiconductor device of the structure A.

That is, as shown in the measurement results of FIG. 15 and. FIG. 16, in comparison with the conventional silicon carbide semiconductor device, the silicon carbide semiconductor device according to the present invention can reduce, under the same on-voltage and the same withstand voltage, the p-n junction electric field intensity, thereby reducing the leakage current.

As described above, according to Embodiment 1 of the present invention, the trade-of improvement index represented by the product of the p-n junction electric field intensity in the off-state and the on-voltage in the on-state can be reduced. Therefore, the effect is such that either or both of the p-n Junction electric field intensity and the on-voltage can be reduced, and the leakage current as well as the power loss in the silicon carbide semiconductor device can be reduced.

Further, in the case where the device is provided even with the second well regions 31 adjacent to and on the bottom faces of the first well regions 30, the condition can be shown for maintaining the trade-off relationship between the p-n junction electric field intensity in the off-state and the on-voltage in the on-state, and thus the effect is such that, using the trade-off relationship between the p-n junction electric field intensity and the on-voltage, a silicon carbide semiconductor device with a high degree of design freedom can be obtained.

Embodiment 2

Figure 17:
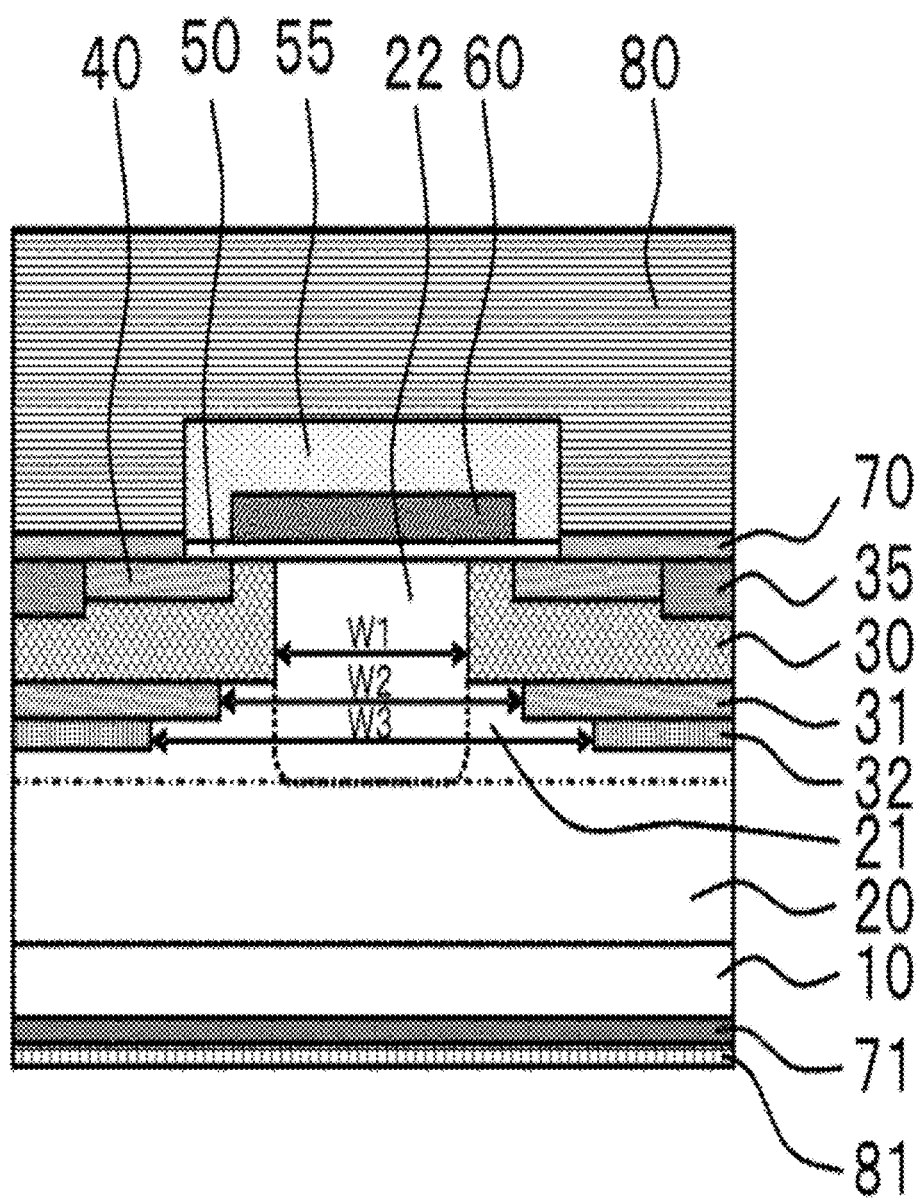
FIG. 17 is a schematic cross-sectional diagram showing a structure of a silicon carbide semiconductor device according to Embodiment 2 of the present invention.

FIG. 17 is a schematic cross-sectional diagram showing a structure of a silicon carbide semiconductor device according to Embodiment 2 of the present invention. It is noted that the components in FIG. 17 indicated by the same reference numerals as those used in FIG. 1 are the same or corresponding components and descriptions thereof will be omitted. The difference in the configuration from Embodiment 1 of the present invention is that p-type third well region is further provided.

The third well regions 32 are formed on the bottom faces of the second well regions 31, electrically connected to the second well regions. The separation distance W3 between adjacent third well regions 32 is formed larger than the separation distance W2 between the second well regions 31. In other words, the width of the third well regions 32 is formed smaller than the width of the second well regions 31. Further, the p-type impurity concentration of the third well region is higher than the n-type impurity concentration of the silicon. carbide drift layer 20 an lower than the p-type impurity concentration of the second well regions 31.

As shown above in the present embodiment 2, similar to the silicon carbide semiconductor device according to Embodiment 1, the effect is such that, by further providing the third well regions 32, the trade-off improvement index represented by the product of the p-n junction electric field intensity in the off-state and the on-voltage in the on-state can be lowered. In addition, the same is applicable in a case where a plurality of well regions is further provided under the third well regions 32.

Embodiment 3

Figure 18:
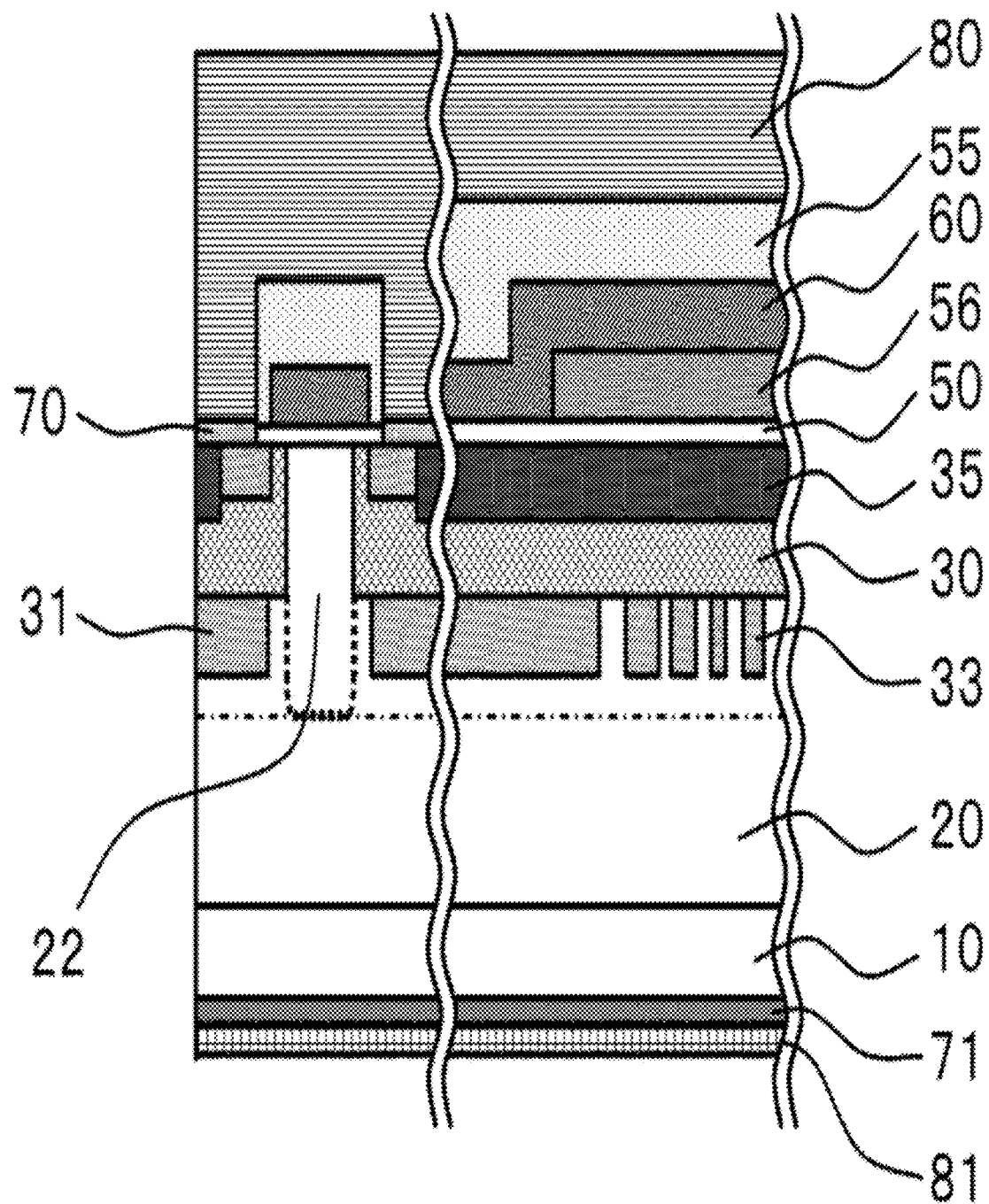
FIG. 18 is a schematic cross-sectional diagram showing a structure of a silicon carbide semiconductor device according to Embodiment 3 of the present invention.

FIG. 18 is a schematic cross-sectional diagram showing a structure of a silicon carbide semiconductor device according to Embodiment 3 of the present invention. It is noted that the components in FIG. 18 indicated by the same reference numerals as those used in FIG. 1 are the same or corresponding components and descriptions thereof will be omitted. The manufacturing method is different from Embodiment 1 of the present invention, and the difference is such that the first well regions are formed after the second well regions are formed, and withstand voltage retention regions at chip end portions are formed simultaneously with the formation of the second well regions.

First, on the top face of the low resistance n-type silicon carbide substrate 10 having the 4H polytype whose crystal orientation of the first main face is (0001), the n-type silicon carbide drift layer 20 is epitaxially grown by a chemical vapor deposition (CVD) method. The n-type impurity concentration of the silicon carbide drift layer 20 is, for example, from $1 \times 10^{15}$ cm$^{-3}$ to $1 \times 10^{17}$ cm$^{-3}$. The thickness of the silicon carbide drift layer 20 is, for example, from 5 μm to 50 μm.

Next, on the top face of the silicon carbide drift layer 20, an implantation mask is formed using photoresist or the like, and Al as the first, impurity of the p-type is ion-implanted. The implantation mask is patterned so that both the second well regions 31 and the withstand voltage retention regions 33 at the chip end portions, shown FIG. 18, can be formed. The depth of the Al ion implantation is from 0.6 μm to 4 μm, which should not be larger than the thickness of the silicon carbide drift layer 20. The impurity concentration of the ion-implanted Al is in the range of 0.1 times or more and less than one time the impurity concentration of the first well regions 30, which should be higher than the n-type impurity concentration of the silicon carbide drift layer 20. Thus, as shown in FIG. 18, the second well regions 31 and the withstand voltage retention regions 33 are formed simultaneously with the same implantation mask. The withstand voltage retention regions 33 are formed at the chip end portions. Then, the implantation mask is removed.

Next the implantation mask is formed on the top face of the silicon carbide drift layer 20 using photoresist or the like, and the first well regions 30 are formed by ion-implanting Al as the first impurity of the p-type. The depth of the Al ion implantation is from 0.5 μm to 3 μm, which should not be larger than the thickness of the silicon carbide drift layer 20, and is formed shallower than the depth of the second well regions 31. Thus, the first well regions 30 and the second well regions 31 are electrically connected. The Al impurity concentration for the ion implantation is higher than the n-type impurity concentration of the silicon carbide drift layer and the p-type impurity concentration of the second well regions 31. The p-type impurity concentration of the first well regions 30 may be, for example, from $1 \times 10^{17}$ cm$^{-3}$ to $1 \times 10^{19}$ cm$^{-3}$. After forming the first well regions 30, the implantation mask is removed.

Then, the silicon carbide semiconductor device is manufactured through the same process as that described in Embodiment 1.

According to the manufacturing method for the silicon carbide semiconductor device shown above in Embodiment 3, the second well regions 31 and the withstand voltage retention regions 33 at the chip end portions can be formed simultaneously, thereby the photolithography processes can be reduced by one time, and thus the effect is that the manufacturing cost of the silicon carbide semiconductor device can be reduced.

Embodiment 4

Figure 19:
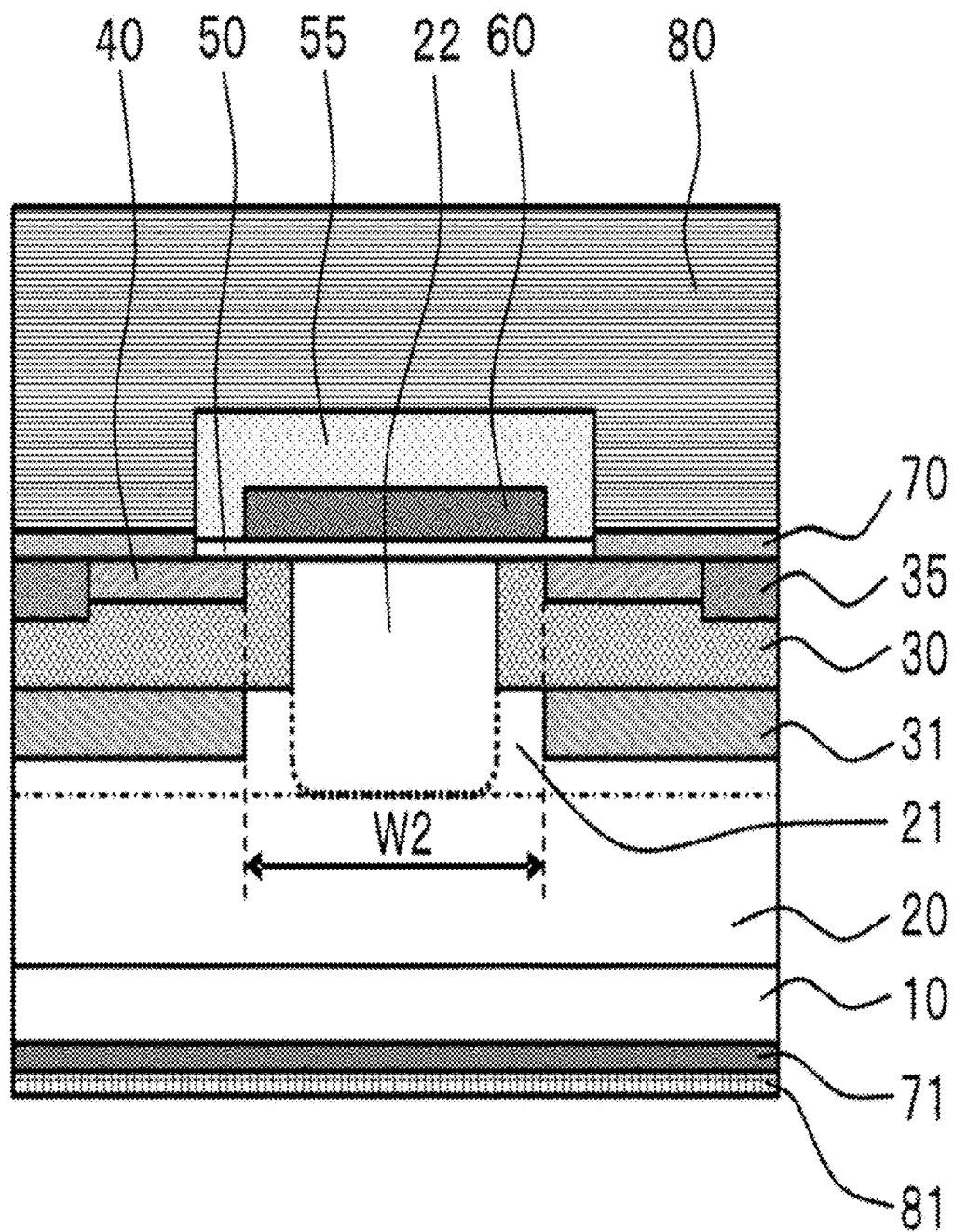
FIG. 19 is a schematic cross-sectional diagram showing a structure of a silicon carbide semiconductor device according to Embodiment 4 of the present invention.

FIG. 19 is a schematic cross-sectional diagram showing a structure of a silicon carbide semiconductor device according to Embodiment 4 of the present invention. Further, FIG. 20 is diagrams showing a manufacturing method for the silicon carbide semiconductor device according to Embodiment 4 of the present invention. It is noted that the components in FIG. 19 and FIG. 20 indicated by the same reference numerals as those used in FIG. 1 and FIG. 2 are the same or corresponding components and descriptions thereof will be omitted. The manufacturing method is different from Embodiment 1 of the present invention, and the difference is such that the implantation mask used to form the second well regions 31 is used to form the source regions.

First with the method described in Embodiment 1, the silicon carbide drift layer 20 is epitaxially grown on the top face of the silicon carbide substrate 10. Similar to Embodiment 1, the n-type impurity concentration of the silicon carbide drift layer 20 is, for example, from $1 \times 10^{15}$ cm$^{-8}$ to $1 \times 10^{17}$ cm$^{-8}$ and the thickness of the silicon carbide drift layer 20 is, for example from 5 μm to 50 μm.

Next, with the method described in Embodiment 1, the first well regions 30 are formed on the top face of the silicon carbide drift layer 20. The depth of the Al ion implantation is from 0.5 μm to 3 μm, which should not be larger than the thickness of the silicon carbide drift layer 20. Similar to Embodiment 1, the impurity concentration of the ion-implanted Al is, for example, from $1\times10^{17}$ cm$^{-3}$ to $1\times10^{19}$ cm$^{-3}$.

Next, with the method described in Embodiment 1, as shown in FIG. 20(a), the implantation mask 91 is formed on the top face of the silicon carbide drift layer 20, and then Al is ion-implanted to form second well regions 31 with the separation distance W2. The depth of the Al ion implantation is from 0.6 μm to 4 μm, which should not be larger than the thickness of the silicon carbide drift layer 20. Similar to Embodiment 1, the impurity concentration of the ion-implanted Al is, for example, 0.1 times or more and less than one time the impurity concentration of the first well regions 30. In the manufacturing method of Embodiment 4, the process after Al is ion-implanted is different from the process in Embodiment 1. The implantation mask 91 that is used for forming the second well region s31 is not removed after the formation of the second well regions, but is used for forming the source regions 40.

Next, as shown in FIG. 20(b), with the implantation mask 91 used for forming the second well regions 31, the source regions 40 are formed by ion-implanting N as the second impurity of the n-type. The depth of the n-type ion implantation is shallower than the depth of the first well regions 30. The impurity concentration of the ion-implanted N should be higher than the p-type impurity concentration of the first well regions 30, and for example, is from $1\times10^{18}$ cm$^{-8}$ to $1\times10^{21}$ cm$^{-8}$ similar to Embodiment 1. After formation of the source regions 40, the implantation mask 91 is removed.

After the process described above with the same process as that described in Embodiment 1, the silicon carbide semiconductor device is manufactured. As a result, as shown in FIG. 19, the silicon carbide semiconductor device in which ends of the source regions 40 and ends of the second well regions 31 are formed substantially in the same position in the lateral direction is manufactured. To be more specific, even considering about ±10% difference introduced due to manufacturing error, the separation distance of the source regions 40 is formed to be 0.9 times to 1.1 times the separation distance W2 between second well regions 31.

As described above, according to the manufacturing method for the silicon carbide semiconductor device shown in Embodiment 4, the second well regions 31 and the source regions 40 can be formed using the same implantation mask 91, thereby the photolithography processes can be reduced by one time, and thus the effect is that the manufacturing cost of the silicon carbide semiconductor device can be reduced.

Embodiment 5

FIG. 21 is diagrams showing a manufacturing method for a silicon carbide semiconductor device according to the present embodiment 5. The silicon carbide semiconductor device which will be described in Embodiment 5 has the same configuration as the silicon carbide semiconductor device shown in Embodiment 1. In comparison with Embodiment 1 of the present invention, the manufacturing method is different in that the second well regions are formed prior to the formation of the first well regions, and the implantation mask used for the formation of the second well regions 31 is processed and then used for the formation of the first well regions 30.

First, through the use of the method described in Embodiment 1, the silicon carbide drift layer 20 is epitaxially grown on the top face of the silicon carbide substrate 10. Similar to Embodiment, the n-type impurity concentration of the silicon carbide drift layer 20 is, for example, from $1\times10^{15}$ cm$^{-3}$ to $1\times10^{17}$ cm$^{-8}$ the thickness of the silicon carbide drift layer 20, for example, is from 5 μm to 50 μm.

Next, as shown in FIG. 21(a), an implantation mask 92 is formed on the top face of the silicon carbide drift layer 20 using photoresist or the like, and then, the second well regions 31 are formed by ion-implanting Al as the first impurity of the p-type. The depth of the Al ion implantation is from 0.6 μm to 4 μm, which should not be larger than the thickness of the silicon carbide drift layer 20. The impurity concentration the ion-implanted Al is in the range of 0.1 times or more and less than one time the impurity concentration of the first well regions 30, which should be higher than the n-type impurity concentration of the silicon carbide drift layer 20.

Next, the implantation mask 92 used for the formation of the second well regions 31 is processed using a method such as etching, curing, or ashing to reduce the width of the implantation mask 92 by a specified amount, and an implantation mask 92a for forming the first well regions 30 is formed as shown in FIG. 21(b). Then, the first well regions 30 are formed by ion-implanting Al as the p-type impurity. The depth of the Al ion implantation is from 0.5 μm to 3 μm, which should not be larger than the thickness of the silicon carbide drift layer 20 and be formed shallower than the depth of the second well regions 31. Thus, the first well regions 30 and the second well regions 31 are electrically connected. The impurity concentration of the ion-implanted Al is higher than the n-type impurity concentration of the silicon carbide drift layer and the p-type impurity concentration of the second well regions 31. The p-type impurity concentration of the first well regions 30 may be, for example, from $1\times10^{17}$ cm$^{-3}$ to $1\times10^{19}$ cm$^{-3}$. After the formation of the first well regions 30, the implantation mask 92a is removed.

After the process described above, with the same process as that described in Embodiment 1, the silicon carbide semiconductor device is manufactured.

As can be seen above, according to the manufacturing method for the carbide semiconductor device shown in Embodiment 5, the photolithographic error between the first well regions 30 and the second well regions 31 is prevented, and thus the silicon carbide semiconductor device with the same electric characteristics can be manufactured with excellent reproducibility, thereby bringing about an effect on the improvement in the manufacturing yield of the silicon carbide semiconductor device.

EXPLANATION OF REFERENCE NUMERALS 10 silicon carbide substrate
20 silicon carbide drift layer
21 JFET region
22 highly concentrated JFET region
30 first well region
31 second well region
35 contact region
40 source region
50 gate insulting film
55 interlayer insulating film
60 gate electrode
70 front side ohmic electrode
71 back side ohmic electrode
80 Source electrode
81 drain electrode

The invention claimed is:

1. A silicon carbide semiconductor device comprising:
a silicon carbide semiconductor substrate;
a silicon carbide drift layer of a first conductive type provided on the silicon carbide semiconductor substrate;
first well regions of a second conductive type provided in surface layer portions of the silicon carbide drift layer;
second well regions of the second conductive type provided adjacent to respective bottom faces of the first well regions;
source regions of the first conductive type provided in respective surface layer portions of the first well regions;
a highly concentrated JFET region of the first conductive type formed deeper than the second well regions and provided between the first well regions as well as between the second well regions, wherein an impurity concentration of the first conductive type is larger than that of the silicon carbide drift layer;
a gate insulating film provided on a top face of the highly concentrated JFET region, top faces of the first well regions, and top faces of the source regions in contact with the highly concentrated JFET region, the first well regions, and the source regions; and
a gate electrode provided on and in contact with the gate insulating film,
wherein a separation distance W2 of the second well regions is larger than a separation distance W1 of the first well regions by 0.8 µm or more and an impurity concentration of the second conductive type in the first well regions is 1.1 times to 4.2 times an impurity concentration of the second conductive type in the second well regions.

2. The silicon carbide semiconductor device according to claim 1, wherein the impurity concentration of the second conductive type in the first well regions is 1.8 times to 3.6 times the impurity concentration of the second conductive type in the second well regions.

3. The silicon carbide semiconductor device according to claim 1, wherein a separation distance between the source regions is 0.9 times to 1.1 times the separation distance between the second well regions.

4. The silicon carbide semiconductor device according to claim 1, wherein a width of the highly concentrated JFET region is equal to the separation distance W2 at a depth where the second well regions is located.

5. The silicon carbide semiconductor device according to claim 1, wherein the first well regions have a thickness in a range from 0.5 µm to 3 µm.

6. The silicon carbide semiconductor device according to claim 1, wherein the second well regions have a peak value of the impurity, concentration of the second conductive type located at a depth from 0.6 µm to 4 µm from a top face of the silicon carbide drift layer.

7. The silicon carbide semiconductor device according to claim 1, further comprising a breakdown voltage retention region of the second conductive type at a chip end portion, baying the impurity concentration of the second conductive type being equal to that of the second well regions.

8. The silicon carbide semiconductor device according to claim 1, further comprising third well regions of the second conductive type provided adjacent to respective bottom faces of the second well regions, wherein, a separation distance W3 between the third well regions is larger than the separation distance W2 and the second well regions have the impurity concentration of the second conductive type larger than that of the third well regions.

9. A manufacturing method for a silicon carbide semiconductor device, comprising:
a first crystal-growing a silicon carbide drill layer of a first conductive type on a silicon carbide semiconductor substrate;
a second forming a first implantation mask on the silicon carbide drift layer and implanting impurity ions of a second conductive type in the silicon carbide drift layer to form a first well region of the second conductive type in a surface layer portion of the silicon carbide drift layer;
a third forming a second implantation mask whose width is larger than the first implantation mask on the silicon carbide drift layer, and implanting impurity ions of the second conductive type in the silicon carbide drift layer to form a second well region of the second conductive type on a region adjacent to a bottom face of the first well region;
a fourth forming a source region of the first conductive type by implanting impurity ions of the first conductive type in a surface layer portion of the first well region;
a fifth implanting impurity ions of the first conductive type into a region ranging from a top face of the silicon carbide drift layer down to a depth larger than the depth of the first well region to form a highly concentrated JFET region of the first conductive type,
a sixth forming a gate insulation film on a top face of the first well region, as top face of the source region, and a top Ike of the highly concentrated JFET region; and
a seventh forming a gate electrode on the gate insulation film.

10. The manufacturing method for the silicon carbide semiconductor device according to claim 9, wherein the source region is formed by implanting impurity ions of the first conductive type in a state where the second implantation mask is formed on the silicon carbide drift layer.

11. The manufacturing method for the silicon carbide semiconductor device according to claim 9, wherein the first implantation mask is formed by processing the second implantation mask to be small in width.

12. The manufacturing method for the silicon carbide semiconductor device according to claim 9, wherein, in the third forming, impurity ions of the second conductive type are implanted also in a chip end portion to form, along with the second well, region, a breakdown voltage retention region of the second conductive type at the chip end portion.

* * * * *